United States Patent
Tsuchida

Patent Number: 5,463,330
Date of Patent: Oct. 31, 1995

[54] CMOS INPUT CIRCUIT

[75] Inventor: Kazuhito Tsuchida, Itami, Japan

[73] Assignee: Mitsubishi Denki Kabushiki Kaisha, Tokyo, Japan

[21] Appl. No.: 273,935

[22] Filed: Jul. 12, 1994

[30] Foreign Application Priority Data

Aug. 20, 1993 [JP] Japan .................. 5-206270

[51] Int. Cl.$^6$ .............................. H03K 19/0175
[52] U.S. Cl. ................................. 326/81; 326/121
[58] Field of Search ........................ 326/81, 121

[56] References Cited

U.S. PATENT DOCUMENTS

| | | | |
|---|---|---|---|
| 4,469,960 | 9/1984 | Raghunathan | 307/264 |
| 4,506,164 | 3/1985 | Higuchi | 307/264 |
| 5,225,721 | 7/1993 | Gal et al. | 307/475 |
| 5,332,934 | 7/1994 | Hashimoto | 307/475 |

*Primary Examiner*—Edward P. Westin
*Assistant Examiner*—Andrew Sanders
*Attorney, Agent, or Firm*—Oblon, Spivak, McClelland, Maier & Neustadt

[57] ABSTRACT

A CMOS circuit (7) receives the potentials $V_{CC}$ and $V_{EE1}$ from potential points (50 and 52), respectively, to apply an output to the gate of a transistor (3a). The drain of the transistor (3a) is connected through a resistor (4) to a potential point (53) providing the potential $V_{EE2}$. The gate of a transistor 6, along with the drain of the transistor (3a), is connected through the resistor (4) to the potential point (53). The gate of a transistor (5) is connected to an input terminal (IN). In this circuit configuration, the time constant of potential drop toward the potential $V_{EE2}$ at the gate of the transistor (6) through the resistor (4) is smaller because the gate capacitance of the transistor (5) does not relate thereto, so that a quick potential drop at the gate of the transistor (6) can be achieved.

32 Claims, 23 Drawing Sheets

CMOS INPUT CIRCUIT

BACKGROUND OF THE INVENTION

1. Field of the Invention

The present invention relates in general to a CMOS input circuit, and more particularly to an input circuit for changing a potential into a different potential of the same logic level.

2. Description of the Background Art

FIG. 23 is a circuit diagram of a conventional CMOS input circuit 70. The CMOS input circuit 70 comprises a P-channel transistor 71 and an N-channel transistor 72. The P-channel transistor 71 and the N-channel transistor 72 are provided with potentials $V_{CC}$ and $V_{EE}$, respectively, corresponding to each level of the binary logic. In response to the logic level of a signal received by an input terminal IN, either of the potentials $V_{CC}$ or $V_{EE}$ is applied to an output terminal OUT in a stable state.

A signal from a device of gate array configuration, for example, takes a potential 0 V or 5 V depending on whether the logic level thereof is "L" or "H". In receiving the signal, the potentials $V_{CC}$ and $V_{EE}$ for the CMOS input circuit 70 are also 0 V and 5 V, respectively, and accordingly, the output terminal OUT is provided with a potential ranging from 0 V to 5 V.

There is a case, however, where an input circuit which receives a signal from a device taking potentials of 0 V and 5 V corresponding to the logic levels "L" and "H" may be connected through its output terminal to a subsequent stage circuit for processing a signal of potential not ranging from 0 V to 5 V. For example, the subsequent stage circuit takes potentials of −5 V and 5 V corresponding to the logic levels "L" and "H". In this case, the CMOS input circuit 70 has a disadvantage that its output terminal OUT can not be connected directly to the subsequent stage circuit.

SUMMARY OF THE INVENTION

The present invention is directed to a CMOS input circuit. According to the present invention, the CMOS input circuit comprises: (a) an input terminal for receiving an input signal corresponding to a first logic level or a second logic level which are complementary to each other; (b) an invertor for receiving the input signal to output an intermediate signal which takes a first potential corresponding to the first logic level when the input signal corresponds to the second logic level, or takes a second potential corresponding to the second logic level when the input signal corresponds to the first logic level; (c) a switching element having a first end provided with a third potential corresponding to the first logic level and a second end, for insulating the first and second ends when the intermediate signal corresponds to the first logic level, or conducting the first and second ends when the intermediate signal corresponds to the second logic level; (d) a first MOS transistor having a gate provided with the input signal, a source provided with a fourth potential corresponding to the first logic level and a drain, for turning off when the input signal corresponds to the first logic level, or turning on when the input signal corresponds to the second logic level; (e) a second MOS transistor having a gate connected to the second end of the switching element, a source provided with a fifth potential corresponding to the second logic level and a drain, for turning on when the third potential is applied to the gate; (f) a current supply circuit connected to the gate of the second MOS transistor, for supplying a current flowing in a direction to turn off the second MOS transistor; and (g) an output terminal connected to the drains of the first and second MOS transistors in common.

Preferably, a gate width of the first MOS transistor is larger than a gate width of the second MOS transistor.

The third potential is equal to the first potential or the fourth potential. The current supply circuit essentially consists of a resistor including a first end connected to the gate of the second MOS transistor and a second end provided with a sixth potential corresponding to the second logic level.

Preferably, a current source substitutes for the resistor.

In the CMOS input circuit in accordance with the present invention, a plurality of different potentials correspond to at least one of the first and second logic levels which are complementary to each other. The first MOS transistor receives the input signal through the gate. When the input signal corresponds to the second logic level, the first MOS transistor turns on. On the other hand, the intermediate signal corresponds to the first logic level, so that the switching element turns off. At this time, the current supply circuit leads the second MOS transistor into an off-state, regardless of the gate capacitance of the first MOS transistor, but with regard only to the gate capacitance of the second MOS transistor. For this reason, the first and second MOS transistors turn on and off, respectively, fundamentally in a complementary manner, and consequently the output terminal is provided with the fifth potential corresponding to the first logic level.

Therefore, it is possible to change a potential into a different potential of the same logic level while turning off the second MOS transistor quickly.

Furthermore, there is a transient period when the first and second MOS transistors are both in an on-state. In another aspect of the present invention, the gate width of the first MOS transistor is larger than that of the second MOS transistor, so that the potential at the output terminal, in an initial state for changing into the fifth potential, is more close to the fifth potential. Moreover, by reducing the gate width of the second MOS transistor, the gate capacitance thereof is also reduced, so that the time constant for the potential change into the fifth potential at the output terminal decreases.

Thus, especially in the aspect of the present invention, since the potential at the output terminal in an initial state for changing into the fifth potential is more close to the fifth potential, and the time constant for the potential change into the fifth potential at the output terminal is smaller, the operation of potential change can be performed more quickly.

The current supply circuit for turning off the second MOS transistor leads the potential at the gate of the second MOS transistor into the sixth potential corresponding to the second logic level by using the resistor, so that electric charges are extracted from the gate with the predetermined time constant. In still another aspect of the present invention, especially, since the current supply circuit essentially consists of the current source, the electric charges are extracted from the gate by a constant current.

Thus, in the aspect of the present invention, the electric charges accumulated in the gate of the second MOS transistor are extracted by the constant current when the second MOS transistor turns off, so that even more quick operation can be achieved.

Accordingly, an object of the present invention is to provide a CMOS input circuit which is capable of changing a potential into a different potential of the same logic level, while achieving a high-speed operation.

These and other objects, features, aspects and advantages of the present invention will become more apparent from the following detailed description of the present invention when taken in conjunction with the accompanying drawings.

DESCRIPTION OF THE PREFERRED EMBODIMENTS

A. The Idea in A Preliminary-Stage of The Present Invention
  (A-1) Circuit Configuration and Operation In advance of a detailed description of the preferred embodiments in accordance with the present invention, an idea, not in accordance with the present invention, but in a preliminary stage of the present invention (hereinafter referred to as "a preliminary-stage idea") will be described referring to a circuit diagram. The preliminary-stage idea merely relates to a technique for changing a potential into a different potential of the same logic level. The present invention described later relates to a CMOS input circuit which achieves a high-speed operation as well as the potential change technique.

Figure 1:
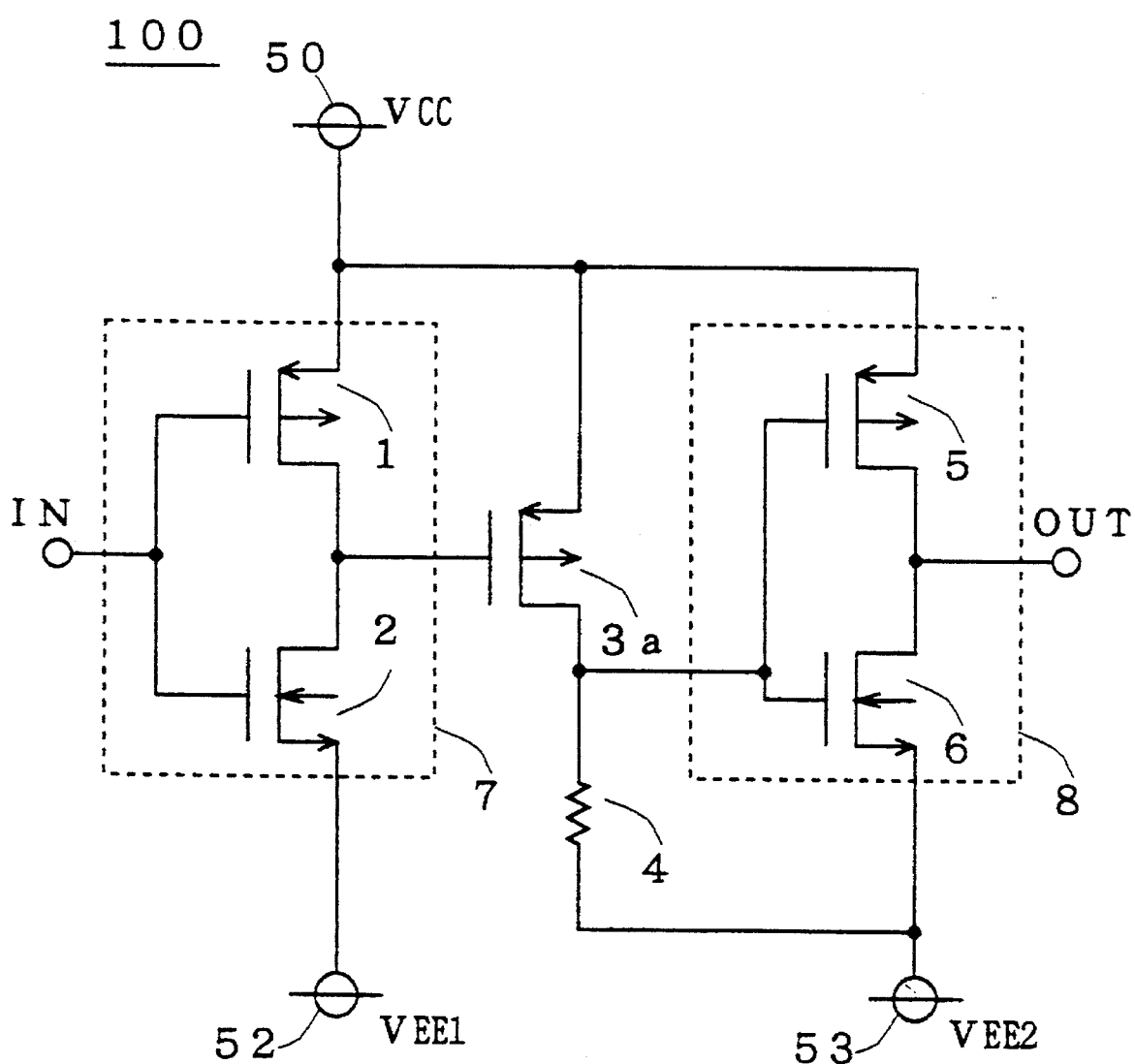
FIG. 1 is a circuit diagram showing an idea in a preliminary stage.

FIG. 1 is a circuit diagram showing a configuration of a CMOS input circuit 100 which embodies the preliminary-stage idea. The CMOS input circuit 100 comprises CMOS circuits 7 and 8 of the same configuration as the conventional CMOS input circuit 70.

The CMOS circuit 7 is provided with a relative high potential, e.g. potential $V_{CC}$ of 5 V, and a relative low potential, e.g. potential $V_{EE1}$ of 0 V. In more detail, the CMOS circuit 7 comprises a P-channel transistor 1 and an N-channel transistor 2, the gates of which are connected in common to an input terminal IN. The source of the P-channel transistor 1 is connected to a potential point 50 providing the potential $V_{CC}$ and the source of the N-channel transistor 2 is connected to a potential point 52 providing a potential $V_{EE1}$.

The gate of a P-channel transistor 3a is connected in common to the drains of the P-channel transistor 1 and the N-channel transistor 2. The drain of the P-channel transistor 3a is connected through a resistor 4 to a potential point 53 providing a potential lower than the potential $V_{EE1}$, e.g. potential $V_{EE2}$ of −5 V. The source of the P-channel transistor 3a is connected to the potential point 50.

The CMOS circuit 8 comprises a P-channel transistor 5 and an N-channel transistor 6, the gates of which are connected in common to the drain of the P-chancel transistor 3a. The source of the P-channel transistor 5 is connected to the potential point 50 and the source of the N-channel transistor 6 is connected to the potential point 53.

An output terminal OUT is connected in common to the drains of the P-channel transistor 5 and the N-channel transistor 6.

Now, the operation of the CMOS input circuit 100 will be described. When the input terminal IN receives a signal which takes the potential $V_{CC}$ corresponding to a logic level "H", the P-channel transistor 1 turns off and the N-channel transistor 2 turns on, and therefore, the CMOS circuit 7 outputs the potential $V_{EE1}$. The potential $V_{EE1}$ is applied to the gate of the P-channel transistor 3a, whereby the P-channel transistor 3a turns on and its drain is provided with the potential $V_{CC}$.

In the CMOS circuit 8, accordingly, the P-channel transistor 5 turns off and the N-channel transistor 6 turns on, and consequently, the potential $V_{EE2}$ is applied to the output terminal OUT.

On the other hand, when the input terminal IN receives a signal which takes the potential $V_{EE1}$ corresponding to a logic level "L", the P-channel transistor 1 turns on and the N-channel transistor 2 turns off, and therefore, the CMOS circuit 7 outputs the potential $V_{CC}$. The potential $V_{CC}$ is applied to the gate of the P-channel transistor 3a, whereby the P-channel transistor 3a turns off and its drain is provided with the potential $V_{EE2}$ through the resistor 4.

In the CMOS circuit 8, accordingly, the P-channel transistor 5 turns on and the N-channel transistor 6 turns off, and consequently, the potential $V_{CC}$ is applied to the output terminal OUT.

Thus, the CMOS input circuit 100 acts as an invertor for inverting the logic level of an input received by an input terminal IN to apply an output of the inverted logic level to an output terminal OUT, and moreover, changes one of the potentials corresponding to the logic levels. That is, the potential at the input terminal IN is the potential $V_{CC}$ or $V_{EE1}$ corresponding to the logic level "H" or "L", and the potential at the output terminal OUT is the potential $V_{CC}$ or $V_{EE2}$ corresponding to the logic level "H" or "L".

(A-2) Problems of The Preliminary-Stage Idea

The CMOS input circuit 100 seems to solve the problems that have been arisen in the conventional art. However, there arises a new problem that it performs a slow operation and is accordingly not suitable to a CMOS circuit requiring a high-speed operation.

As mentioned earlier, when the P-channel transistor 3a turns off, its drain is ultimately provided with the potential $V_{EE2}$ through the resistor 4. The drain of the P-channel transistor 3a is connected in common to both the gates of the P-channel transistor 5 and the N-channel transistor 6 in the CMOS circuit 8. For this reason, a potential inputted to the CMOS circuit 8 drops according to a time constant which depends on the gate capacitances of the two transistors 5, 6 and the resistance 4. Therefore, the potential change of an output towards the potential $V_{EE2}$ does not sharply performed. Since the output from the CMOS circuit 8 is directly applied to the output terminal OUT, the slow potential change results in a slow operation of the CMOS input circuit 100.

The present invention achieves a high-speed operation, along with the effect of the preliminary-stage idea, i.e., the potential change of the same logic level.

Figure 2:
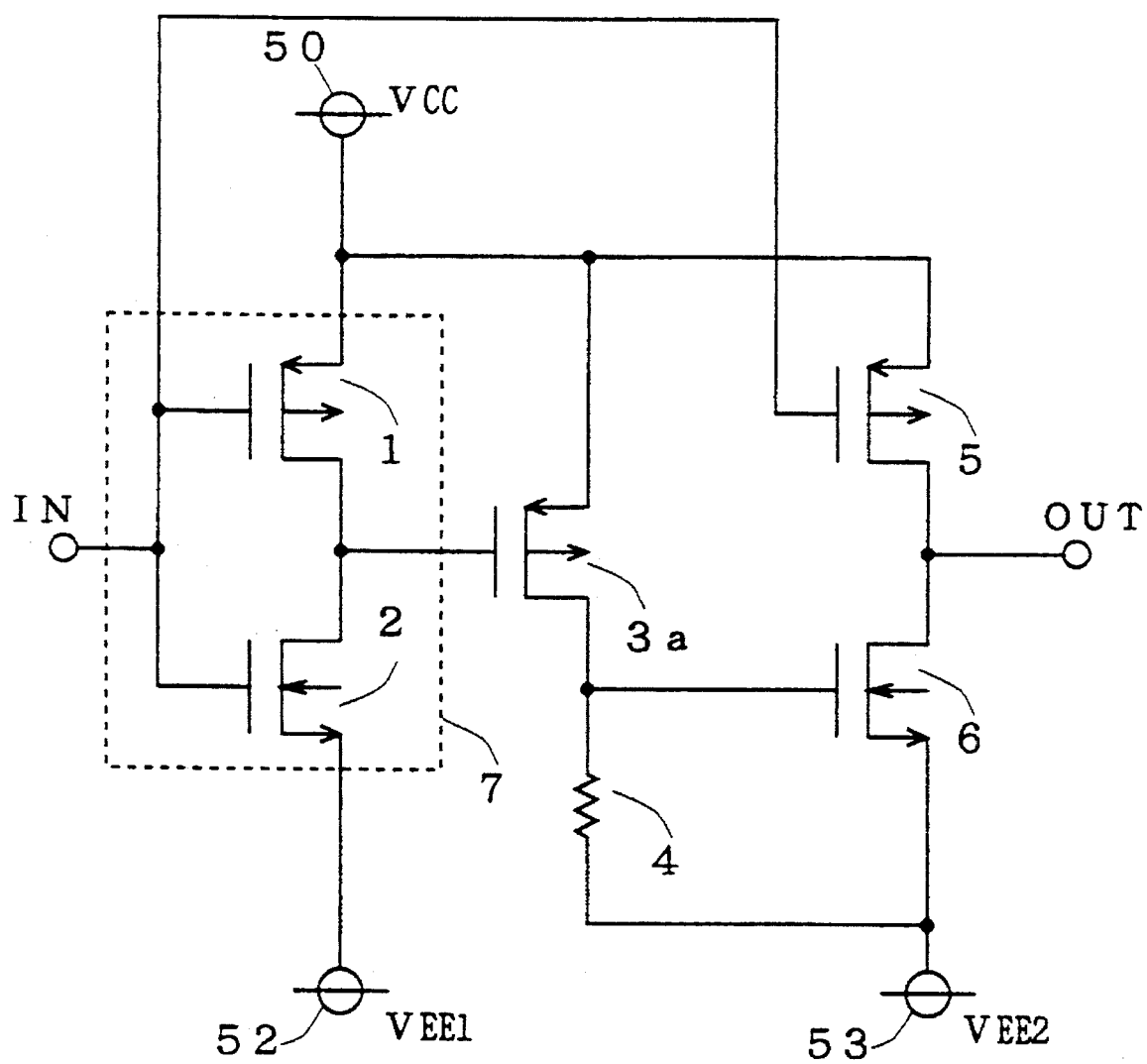
FIG. 2 is a circuit diagram showing a first preferred embodiment in accordance with the present invention.

B. Preferred Embodiments of Potential Change for One Logic Level (B-1) The First Preferred Embodiment FIG. 2 is a circuit diagram showing a configuration of a CMOS input circuit 101 in accordance with a first preferred embodiment of the present invention. In the same manner as the CMOS input circuit 100 in the preliminary-stage idea, a CMOS circuit 7 is provided with the potential $V_{CC}$ or $V_{EE1}$ through an input terminal IN and applies an output to the gate of a P-channel transistor 3a. The drain of the P-channel transistor 3a is connected to a potential point 53 through a resistor 4, like in the CMOS input circuit 100.

However, unlike in the CMOS input circuit 100, the gates of a P-channel transistor 5 and an N-channel transistor 6 are not connected in common. Although the gate of the N-channel transistor 6, along with the drain of the P-channel transistor 3a, is connected to the potential point 53 through the resistor 4 like in the CMOS input circuit 100, the gate of the P-channel transistor 5 is connected to the input terminal IN. That is, the CMOS input circuit 101 in accordance with the first preferred embodiment of the present invention is different from the CMOS input circuit 100 in accordance with the preliminary-stage idea in the connection of the gate of the P-channel transistor 5.

Now, the operation of the CMOS input circuit 101 will be described. When the input terminal IN receives a signal which takes the potential $V_{CC}$ corresponding to a logic level "H", the P-channel transistor 3a turns on and its drain is provided with the potential $V_{CC}$. Accordingly, the N-channel transistor 6 turns on. The P-channel transistor 5, the gate of which is connected to the input terminal IN, receives the potential $V_{CC}$ to thereby turn off. Therefore, the potential $V_{EE2}$ is applied to the output terminal OUT.

On the other hand, when the input terminal IN receives a signal which takes the potential $V_{EE1}$ corresponding to a logic level "L", the P-channel transistor 3a turns off. At this time, the P-channel transistor 5 receives the potential $V_{EE1}$ through the gate, to thereby turn on. Since a regular circuit for applying a signal to the input terminal IN has a great driving capability, the switching operation is quickly performed. On the other hand, the potential at the gate of the N-channel transistor 6 begins to drop toward the potential $V_{EE2}$ through the resistor 4. The time constant of the potential drop, having no relation to the gate capacitance of the P-channel transistor 5, is smaller than that of the CMOS input circuit 100. Hence, the potential drop at the gate of the N-channel transistor 6 can be performed more quickly.

For this reason, the N-channel transistor 6 turns off more quickly as compared with the case of the CMOS input circuit 100. Therefore, the potential at the output terminal OUT reaches the potential $V_{CC}$ in a shorter time.

Thus, the CMOS input circuit 101 has a function to perform a potential change of the same logic level for one logic level, like the CMOS input circuit 100, and moreover achieves a high-speed operation.

Figure 3:
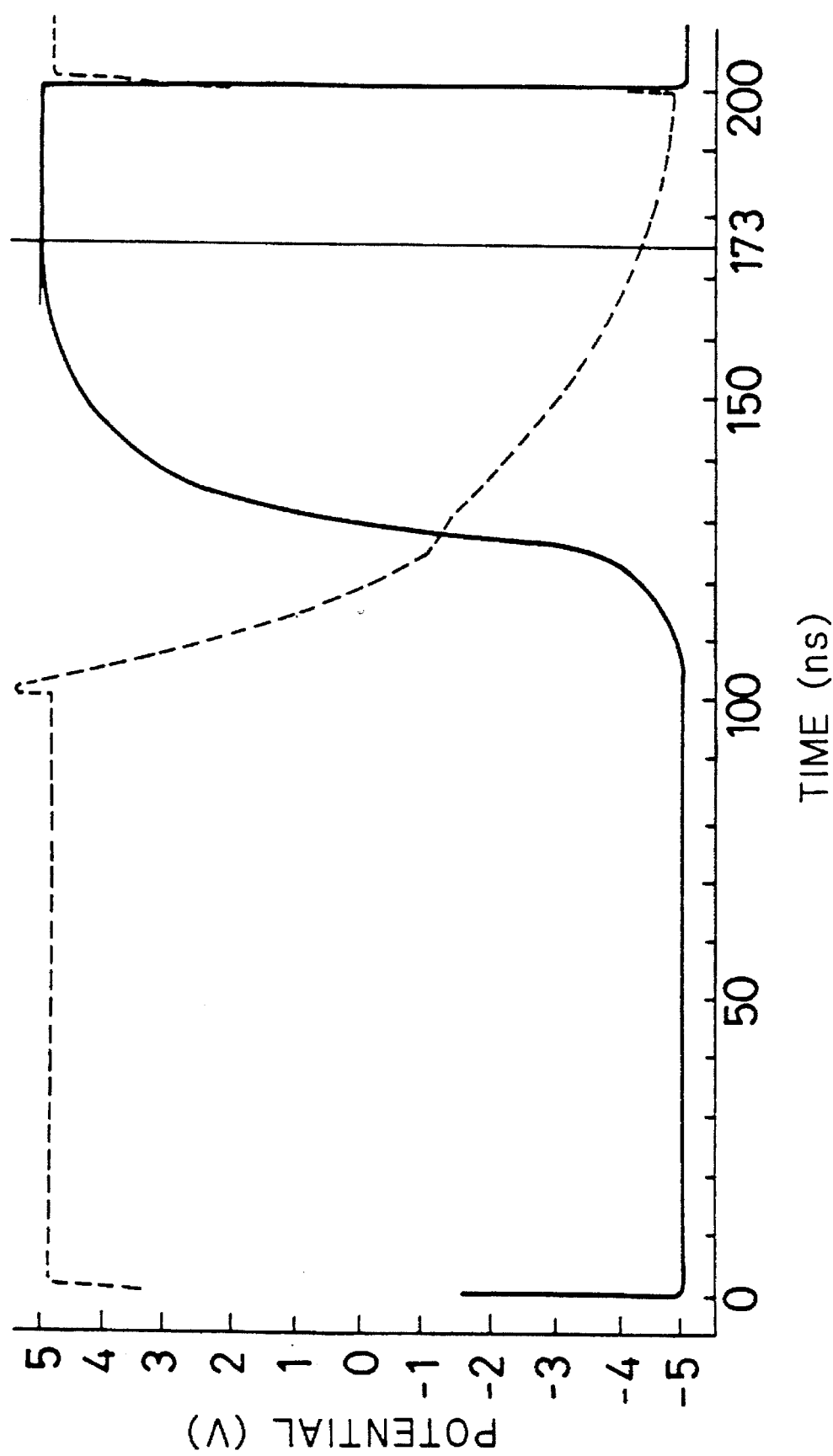
FIGS. 3 and 4 are graphs showing an effect of the first preferred embodiment in accordance with the present invention.
Figure 4:
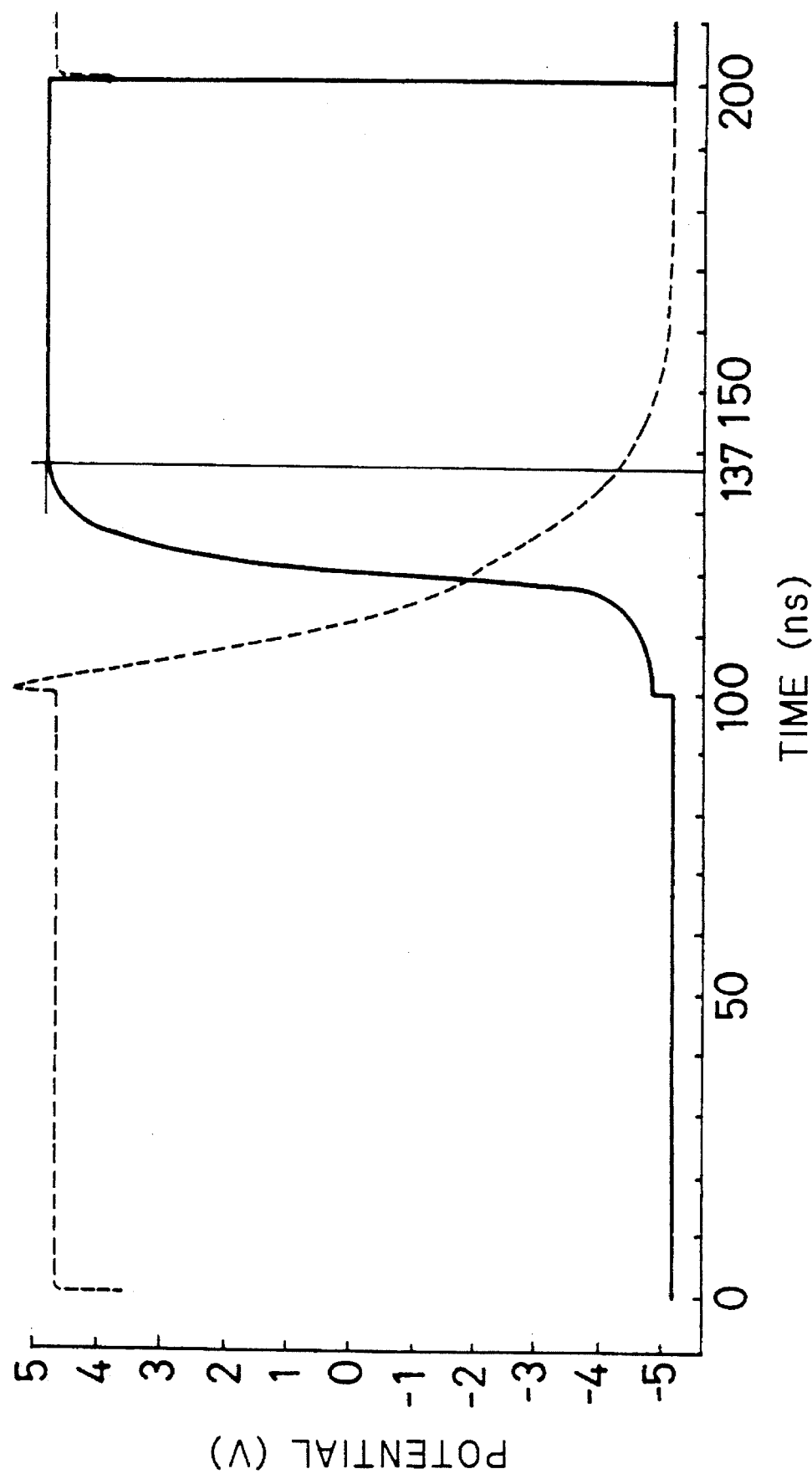

FIGS. 3 and 4 are simulation graphs showing an effect of the first preferred embodiment. FIG. 3 shows the operation of the CMOS input circuit 100 in accordance with the preliminary-stage idea of FIG. 1, while FIG. 4 shows the operation of the CMOS input circuit 101 in accordance with the first preferred embodiment. In the simulation, it is determined that all of the gates have a uniform width of 50 µm, the resistor 4 has a resistance of 100 KΩ, and the potentials $V_{CC}$, $V_{EE1}$ and $V_{EE2}$ are 5 v, 0 V and −5 V, respectively. Accordingly, when the P-channel transistor 3a turns on, a current of 100 µA flows in the resistor 4. Further, a rectangular wave taking 0 v or 5 V is inputted to the input terminal IN in a 20 ns cycle. Specifically, the rectangular wave is set to fall from 5 v to 0 V at the time of 0 ns, to rise from 0 V to 5 V at the time of 100 ns and to fall from 5 V to 0 V at the time of 200 ns, which is not shown to make the graphs simple.

In each graph, a solid line represents a waveform of the potential at the output terminal OUT and a broken line represents that of the potential at the gate of the N-channel transistor 6. The graphs clearly show that a time required for the potential change (hereinafter referred to as "time for potential change") at the output terminal OUT in the CMOS input circuit 100 is approximately 73 ns, while a time for potential change in the CMOS input circuit 101 is improved to be approximately 37 ns. It is believed that the improvement in the time for potential change results from the sharp drop of the potential at the gate of the N-channel transistor 6 as indicated in the broken line. This is caused by the reduction in the capacitance of the gate which is connected to the potential point 53 through the resistor 4. Thus, the CMOS input circuit 101 achieves a short time for potential change, so that it can respond to a signal of 20 MHz.

(B-2) Variation of The First Preferred Embodiment

The simulation shown in (B-1) relates to the case where all of the gates of the transistors have a uniform width of 50 µm. It is possible to further improve the time for potential change in the CMOS input circuit 101 by controlling each gate width of the P-channel transistor 5 and the N-channel transistor 6.

Figure 5:
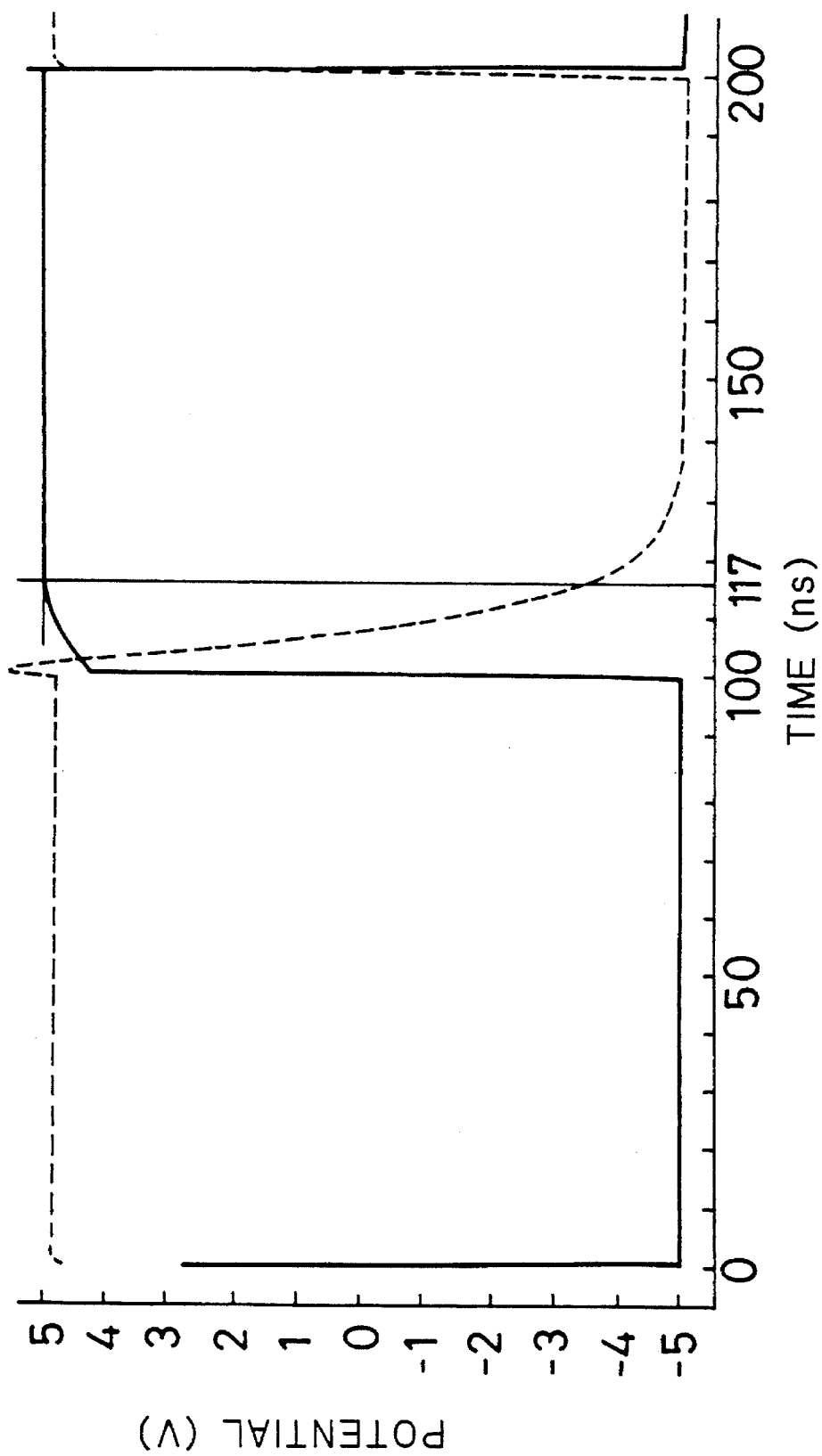
FIGS. 5, 6, 7, 8 and 9 are graphs showing effects of variations of the first preferred embodiment in accordance with the present invention.

FIG. 5 is a graph showing a simulation result under the same condition as FIG. 4 except that the gate of the P-channel transistor 5 has a 10 times larger width than that of FIG. 4, namely 500 µm, and the gate of the N-channel transistor 6 has a 0.4 times larger width than that of FIG. 4, namely 20 µm. In this case, the time for potential change is approximately 17 ns, which is further reduced as compared with the case of FIG. 4.

Figure 6:
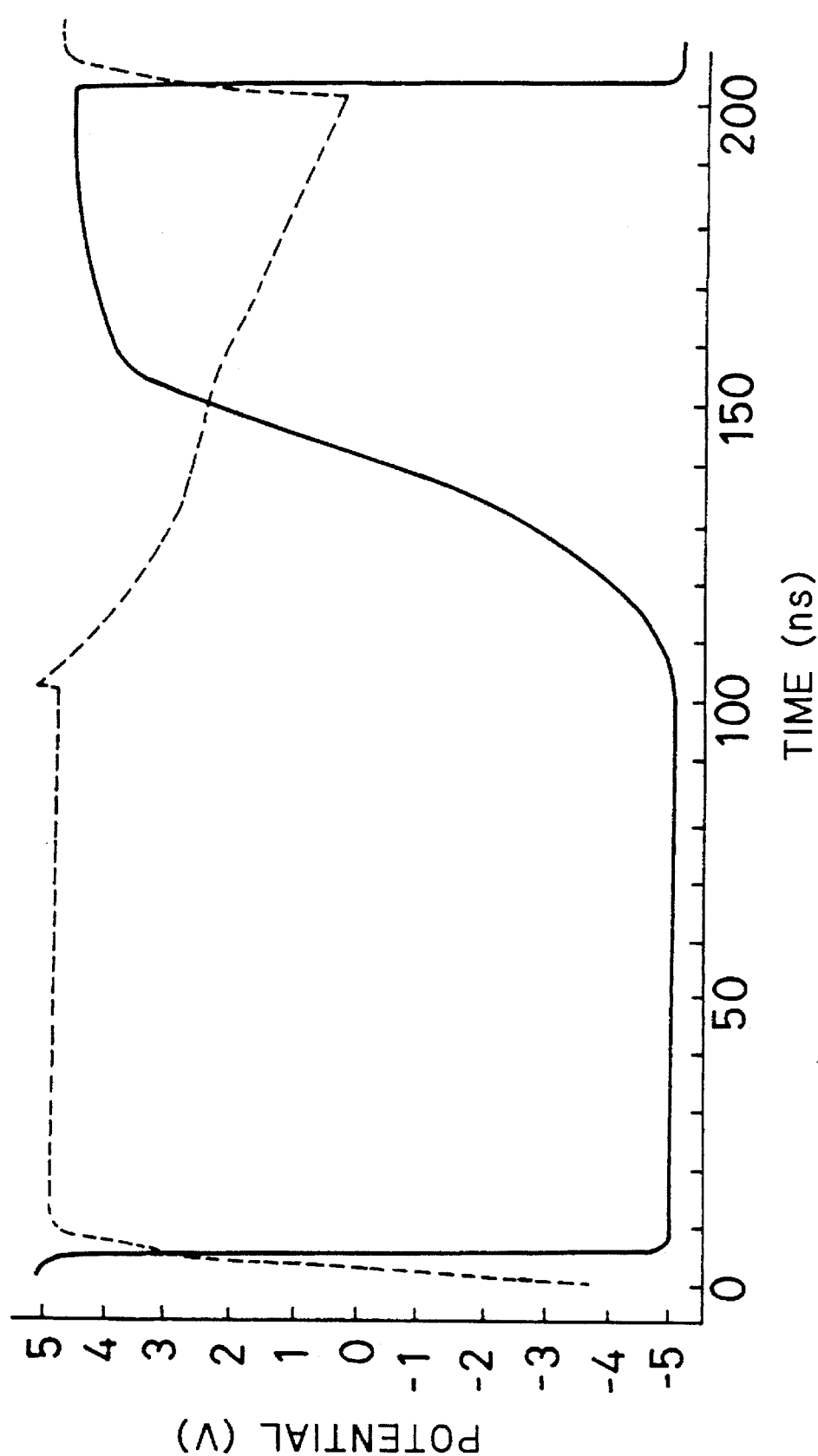

There is a remarkable difference in effect between the present invention and the preliminary-stage idea when each size of the transistors is controlled. FIG. 6 is a graph showing a simulation result under the same condition as FIG. 3 except that the gate of the P-channel transistor 5 has a 10 times larger width than that of FIG. 3, namely 500 µm, and the gate of the N-channel transistor 6 has a 0.4 times larger width than that of FIG. 3, namely 20 µm. In this case, the potential at the output terminal OUT can not reach 5 V and the time for potential change is beyond 100 ns. It can be seen from the result that the time for potential change is deteriorated as compared with the case of FIG. 3 (the time for potential change of 73 ns).

The same control of transistor size results in an improvement in the present invention, and on the contrary, results in a deterioration in the preliminary-stage idea. It is believed that the cause is the gate capacitance of the transistor.

In the CMOS input circuit 101 (in accordance with the present invention), the gate capacitance of the P-channel transistor 5 is not related to the time constant of potential drop at the potential point 53, while in the CMOS input circuit 100 (in accordance with the preliminary-stage idea), the gate capacitance of the P-channel transistor 5 is related to. For this reason, as the gate width of the P-channel transistor 5 is enlarged to increase the gate capacitance, the operation of the CMOS input circuit 100 becomes slower.

Figure 7:
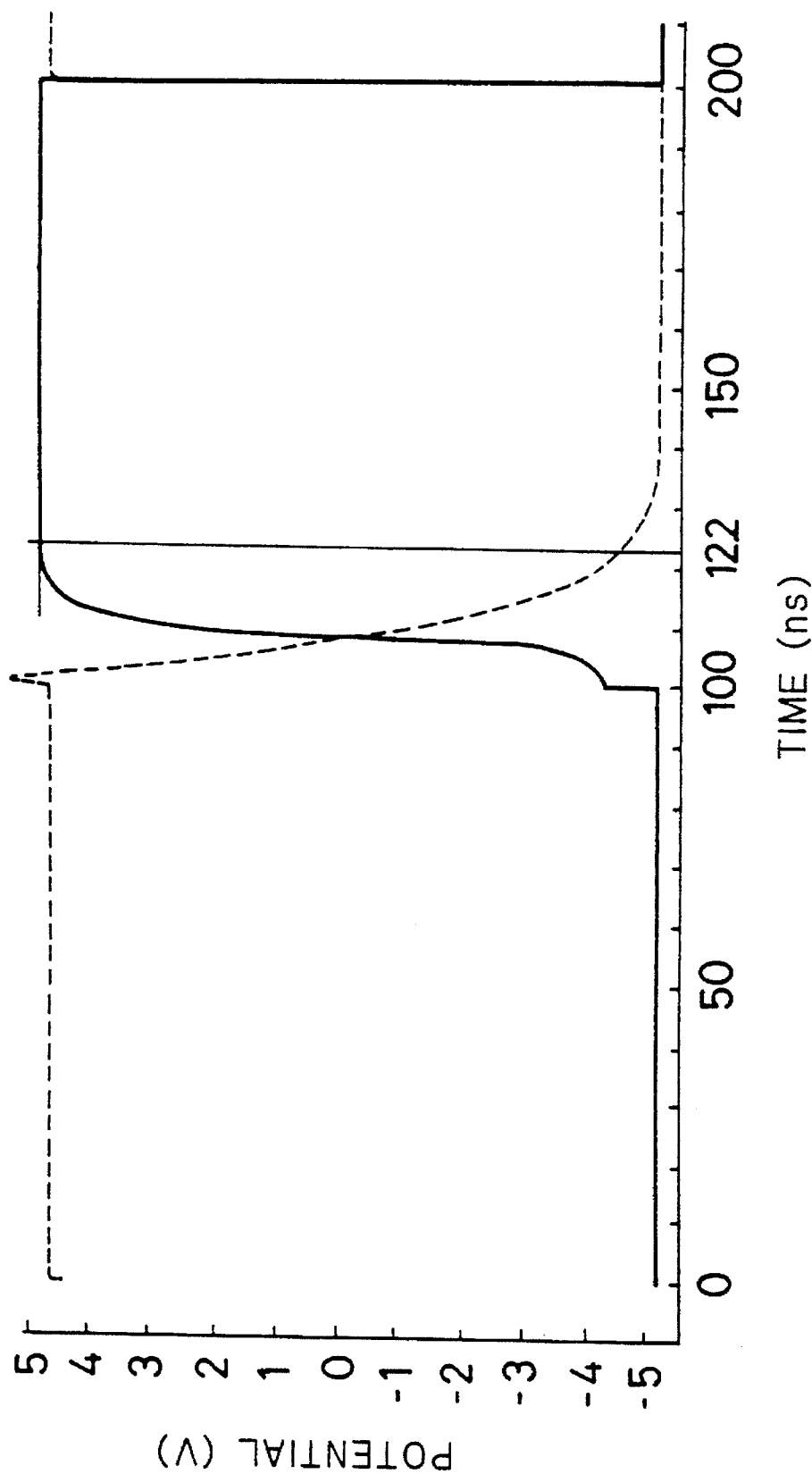

Next, the reason why the time for potential change is further reduced by controlling the transistor size in the present invention will be described. FIG. 7 is a graph showing a simulation result under the same condition as FIG. 4 except only that the gate of the N-channel transistor 6 has a 0.4 times larger width than that of FIG. 4, namely 20 µm. In this case, the time for potential change is approximately 22 ns, which is still longer than the time for potential change of FIG. 5 (17 ns) but is shorter than that of FIG. 4 (37 ns). That is, it is possible to improve the time for potential change by reducing only the gate width of the N-channel transistor 6. It is believed that the gate capacitance of the N-channel transistor 6 is reduced, to thereby decrease the time constant which depends on the product of the gate capacitance of the N-channel transistor 6 and the resistance 4, and therefore the N-channel transistor 6 quickly turns off, resulting in a reduction in time for potential change.

Figure 8:
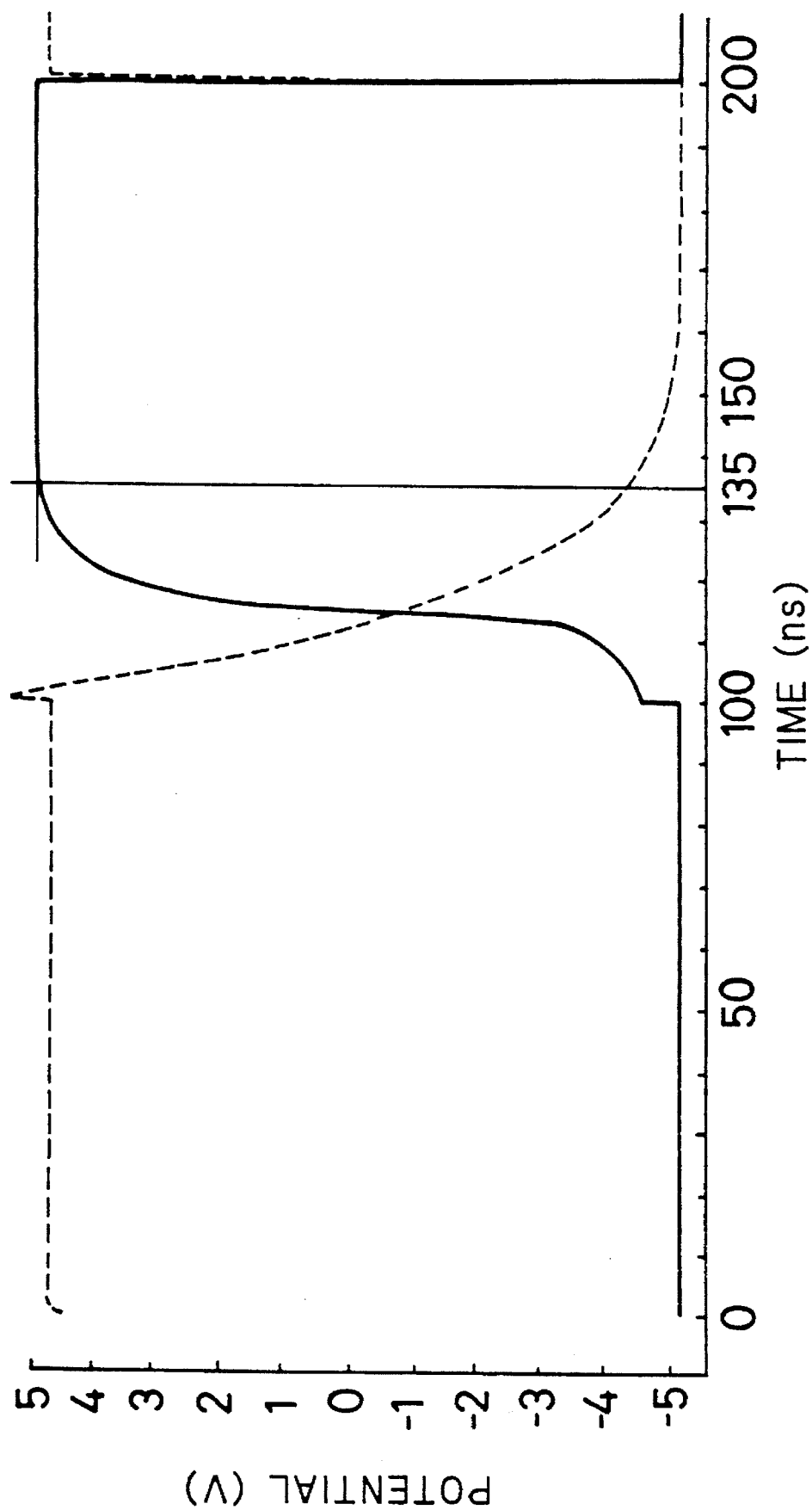
Figure 9:
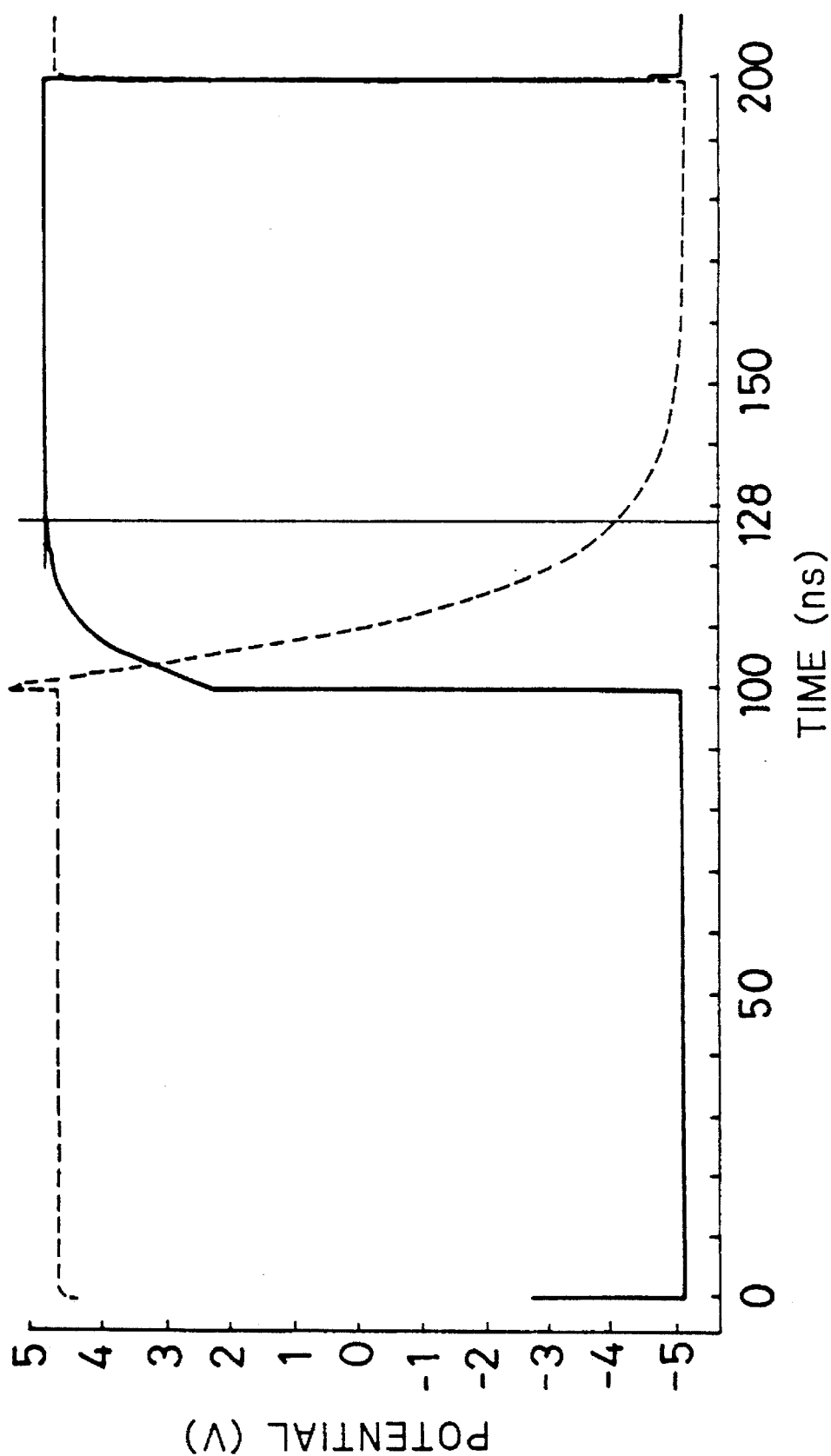

On the other hand, it is possible to improve the time for potential change by increasing only the gate width of the N-channel transistor 5. FIGS. 8 and 9 are graphs showing simulation results under the same condition as FIG. 4 except only that the gate of the N-channel transistor 5 has a 2 times larger width than that of FIG. 4, namely 100 µm, and a 10 times larger width than that of FIG. 4, namely 500 µm, respectively. The time for potential change is approximately 35 ns in the case of FIG. 8, and approximately 28 ns in the case of FIG. 9. Those are still longer than the time for potential change of FIG. 5 (17 ns), but are shorter than that of FIG. 4 (37 ns). Therefore, it is possible to improve the time for potential change by increasing only the gate width of the N-channel transistor 5. Although the gate capacitance of the P-channel transistor 5 is not directly related to the time for potential change, an ON-resistance of the P-channel transistor 5 is believed to cause a reduction in time for potential change.

Figure 10:
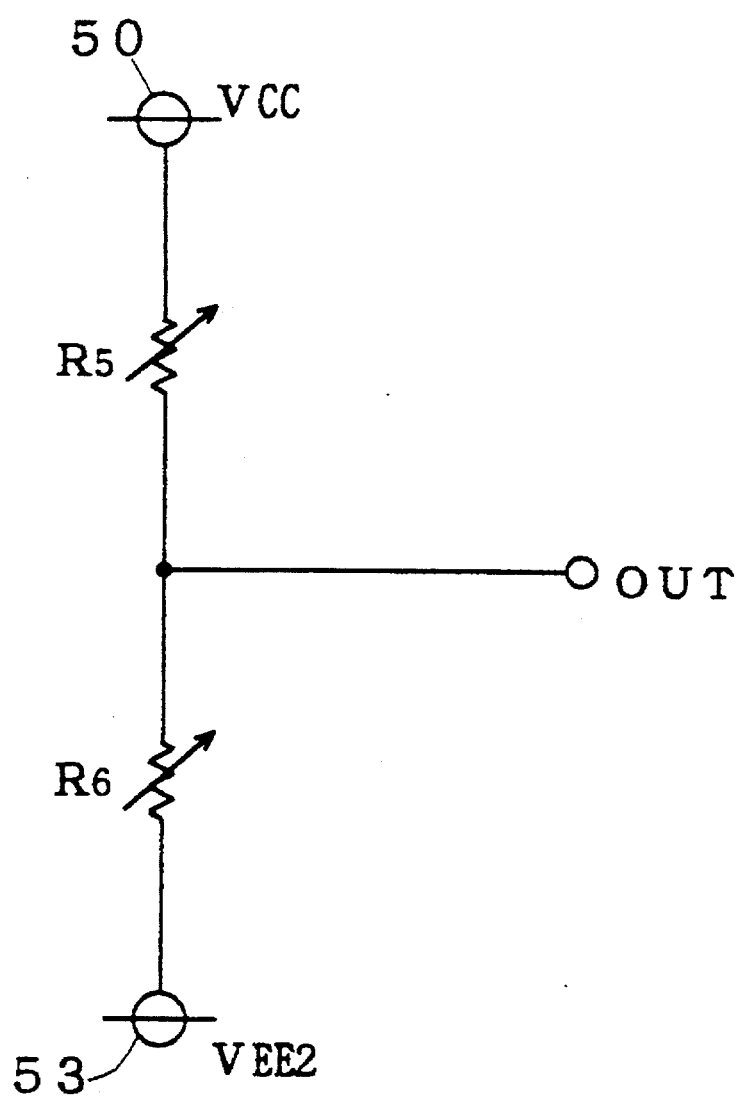
FIG. 10 is a circuit diagram illustrating the effect of the variation of the first preferred embodiment in accordance with the present invention.

FIG. 10 is an equivalent representation in the vicinity of the output terminal OUT. In both the CMOS input circuit 100 and the CMOS input circuit 101, the vicinity of the output terminal OUT is equivalently shown by a source-drain resistance $R_5$ of the P-channel transistor 5 connected between the potential point 50 and the output terminal OUT, and a source-drain resistance $R_6$ of the N-channel-transistor 6 connected between the potential point 53 and the output terminal OUT.

The resistances $R_5$ and $R_6$ are represented as variable resistances which allow various values depending on the state of the respective transistors. Since the potential at the gate of the N-channel transistor 6 gradually drops according to the time constant which depends on the resistance 4 and the gate capacitance of the N-channel transistor 6, the value of the resistance $R_6$ is still small, about the value of the ON-resistance of the N-channel transistor 6, immediately after the potential change from the potential $V_{CC}$ to the potential $V_{EE1}$ of the signal received by the input terminal IN.

On the other hand, since the gate of the P-channel transistor 5 is connected to the input terminal IN, the P-channel transistor 5 turns on immediately after the change of potential from the potential $V_{CC}$ to the potential $V_{EE1}$ of the signal received by the input terminal IN. Therefore, the value of the resistance $R_5$ quickly drops to the value of the ON-resistance of the P-channel transistor 5.

Accordingly, immediately after the potential change from the potential $V_{CC}$ to the potential $V_{EE1}$ of the signal received by the input terminal IN, a pass current flows in the P-channel transistor 5 and the N-channel transistor 6. For this reason, as the value of the resistance $R_5$ decreases, a voltage drop across the resistance $R_5$ becomes smaller, and therefore, the potential at the output terminal OUT immediately rises towards the potential $V_{CC}$, which is provided by the potential point 50. Since the ON-resistance of the P-channel transistor 5 is reduced by enlarging the gate width of the P-channel transistor 5, the value of the resistance $R_5$ shown in FIG. 10 can be reduced.

After that, the N-channel transistor 6 turns off due to the potential drop at the gate, whereby the value of the resistance $R_6$ becomes much larger, and after the time for potential change, the potential at the output terminal OUT reaches the potential $V_{CC}$. However, by enlarging the gate width of the P-channel transistor 5, the potential at the output terminal OUT can be increased immediately after the potential change from the potential $V_{CC}$ to the potential $V_{EE1}$ of the signal received by the input terminal IN, so that it is possible to reduce the time for potential change.

Thus, a further improvement in the effect of the first preferred embodiment of the present invention can be achieved by enlarging the gate width of the transistor whose gate is connected to the input terminal IN and narrowing the gate width of the transistor whose gate is connected to the potential point through the resistor.

(B-3) The Second Preferred Embodiment

Figure 11:
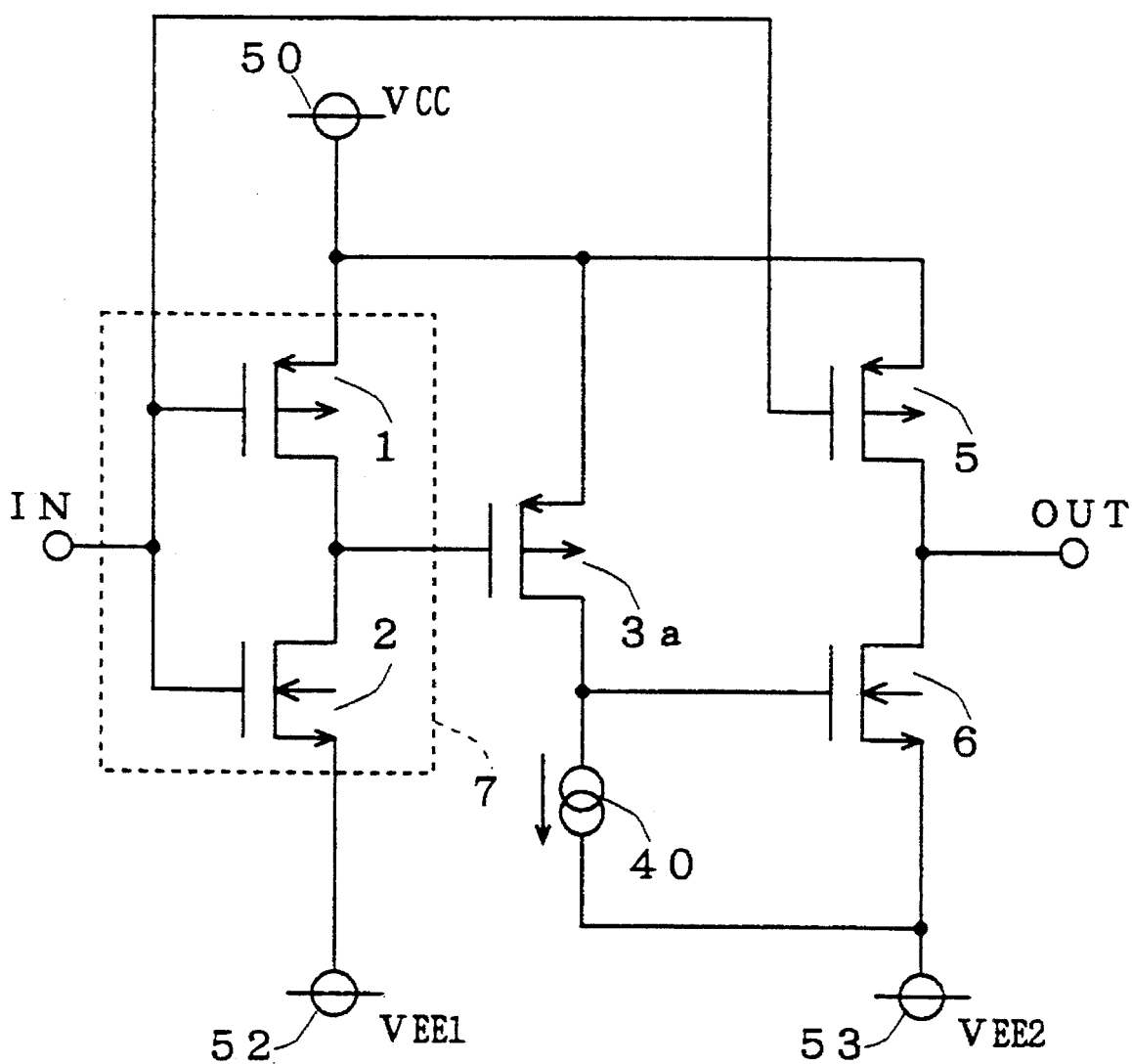
FIG. 11 is a circuit diagram showing a second preferred embodiment in accordance with the present invention.

FIG. 11 is a circuit diagram showing a configuration of a CMOS input circuit 102 in accordance with a second preferred embodiment of the present invention. The CMOS input circuit 102 has the same configuration as the CMOS input circuit 101 except that a current source 40 is provided instead of the resistor 4. Such a configuration as above also makes it possible to reduce the time for potential change as compared with the CMOS input circuit 100 in accordance with the preliminary-stage idea.

Figure 12:
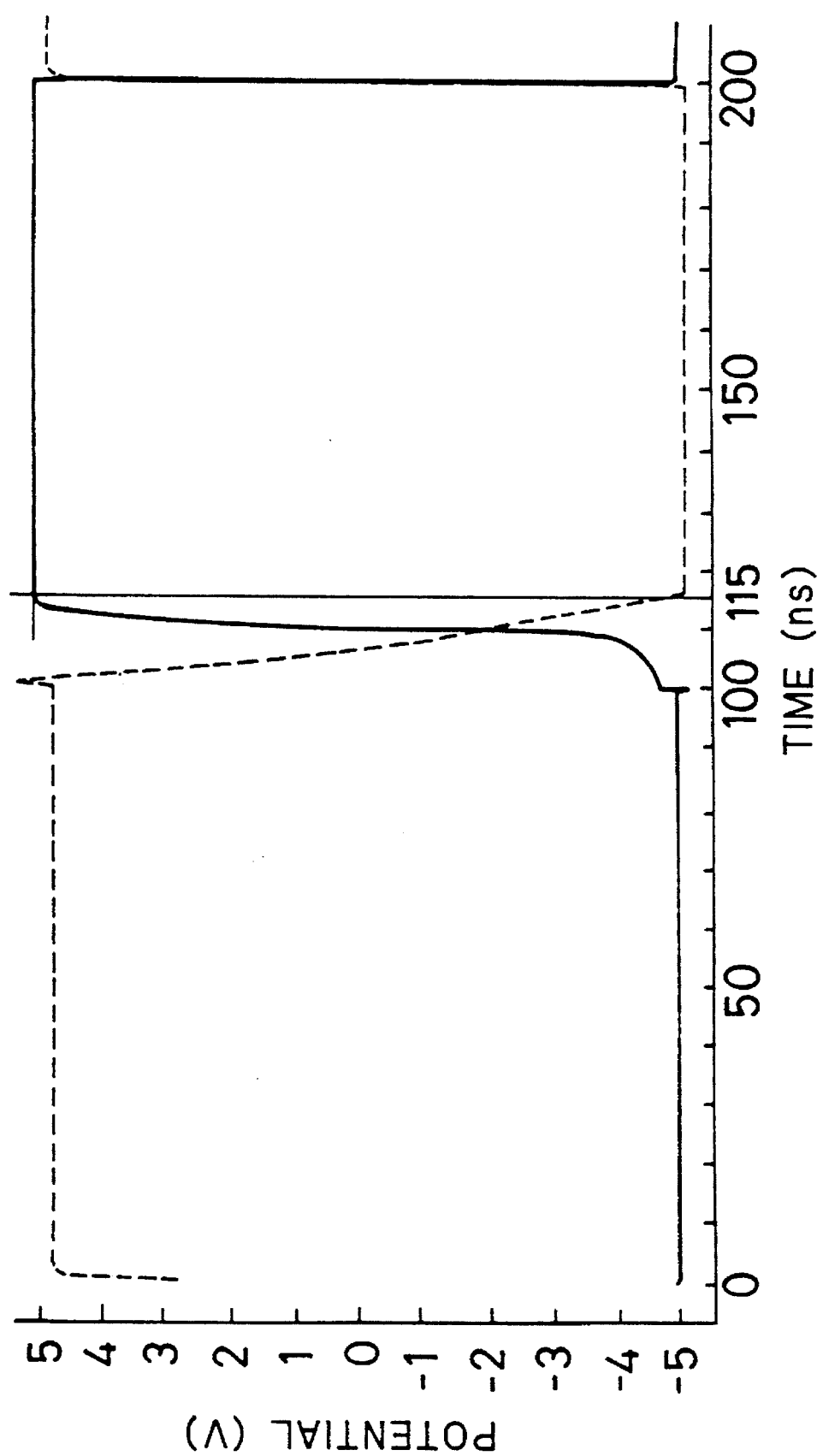
FIG. 12 is a graph showing an effect of the second preferred embodiment in accordance with the present invention.

FIG. 12 is a simulation graph of the operation of the CMOS input circuit 102. The figure shows a result of the same simulation performed under the same condition as shown in FIG. 4 except that the current value in the current source 40 is set equal to the current value flowing in the resistor 4 when the P-channel transistor 3a of the CMOS input circuit 101 turns on (where the ON-resistance is not taken into account), namely 100 µA.

Figure 13:
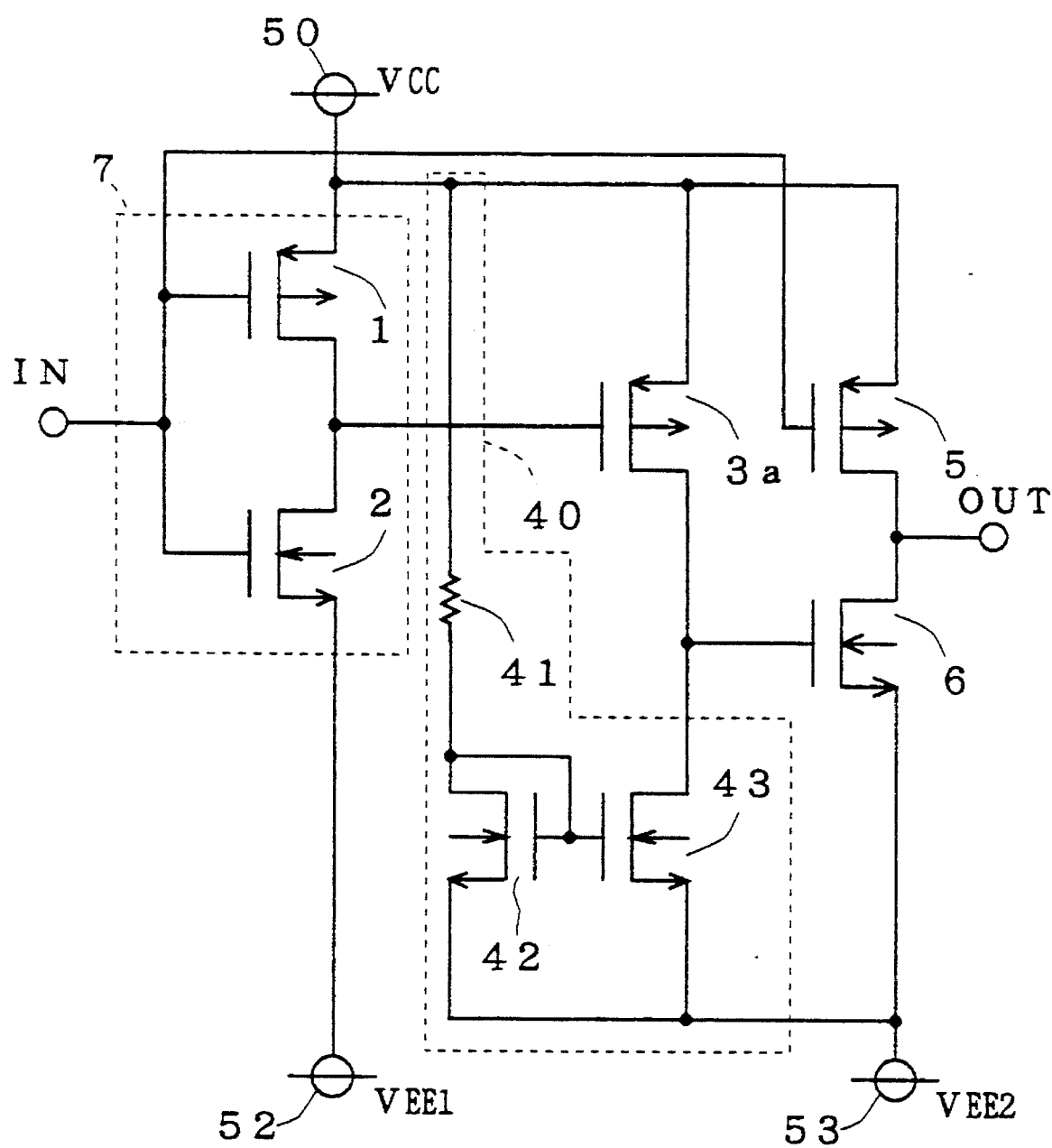
FIG. 13 is a circuit diagram showing the second preferred embodiment in accordance with the present invention.

A CMOS input circuit 102a of FIG. 13 is an example of a circuit which can be used in the above simulation. The current source 40 has a current mirror circuit configuration consisting of N-channel transistors 42 and 43 and a resistor 41. The resistor 41 has a resistance value equal to that of the resistor 4, and is connected to the potential point 50, the drain and gate of the N-channel transistor 42 and the gate of the transistor 43 in common. The sources of the N-channel transistors 42 and 43 are connected in common to the potential point 53. The drain of the N-channel transistor 43 is connected to the drain of the P-channel transistor 3a and the gate of the transistor 6, in common. In the simulation of FIG. 12, the time for potential change is approximately 15 ns, which is further reduced as compared with that of FIG. 4. The reduction of the time for potential change results from that the current flowing from the gate of the N-channel transistor 6 to the potential point 53, which extracts positive charges accumulated in the gate capacitance of the N-channel transistor 6, is maintained constant by using the current source 40 in the CMOS input circuit 102, while it gradually decreases through the resistor 4 in the CMOS input circuit 101. A semi-quantitative description about this will be given below.

Assuming that the gate capacitance of the N-channel transistor 6 is 0.14 pF, in an ideal operating condition of the CMOS circuit 7 in the CMOS input circuit 101, the potential at the gate of the N-channel transistor 6 reaches 0 V after $$\tau 1 = \left( \ln \frac{100}{100} - \ln \frac{50}{100} \right) \times 100 \, k\Omega \times 0.14 \, pF \quad (1)$$

$$\approx 9.5 \, ns$$

from the time of 100 ns. On the other hand, in the CMOS input circuit 102, assuming that the amount of charges to be extracted is Q, the potential at the gate of the N-channel transistor 6 reaches 0 V after $$t2 = \frac{Q}{i} = \frac{0.14 \, pF \cdot \left( 10 \, V \times \frac{50}{100} \right)}{100 \, \mu A} = 7 \, ns \quad (2)$$

from the time of 100 ns.

Although other factors should be taken into account in an actual case, as can be seen from the Formulae 1 and 2, it is possible to achieve a further high-speed operation by using the current source 40 to extract the charges accumulated in the gate of the N-channel transistor 6 with the constant current.

(B-4) The Third Preferred Embodiment

Figure 14:
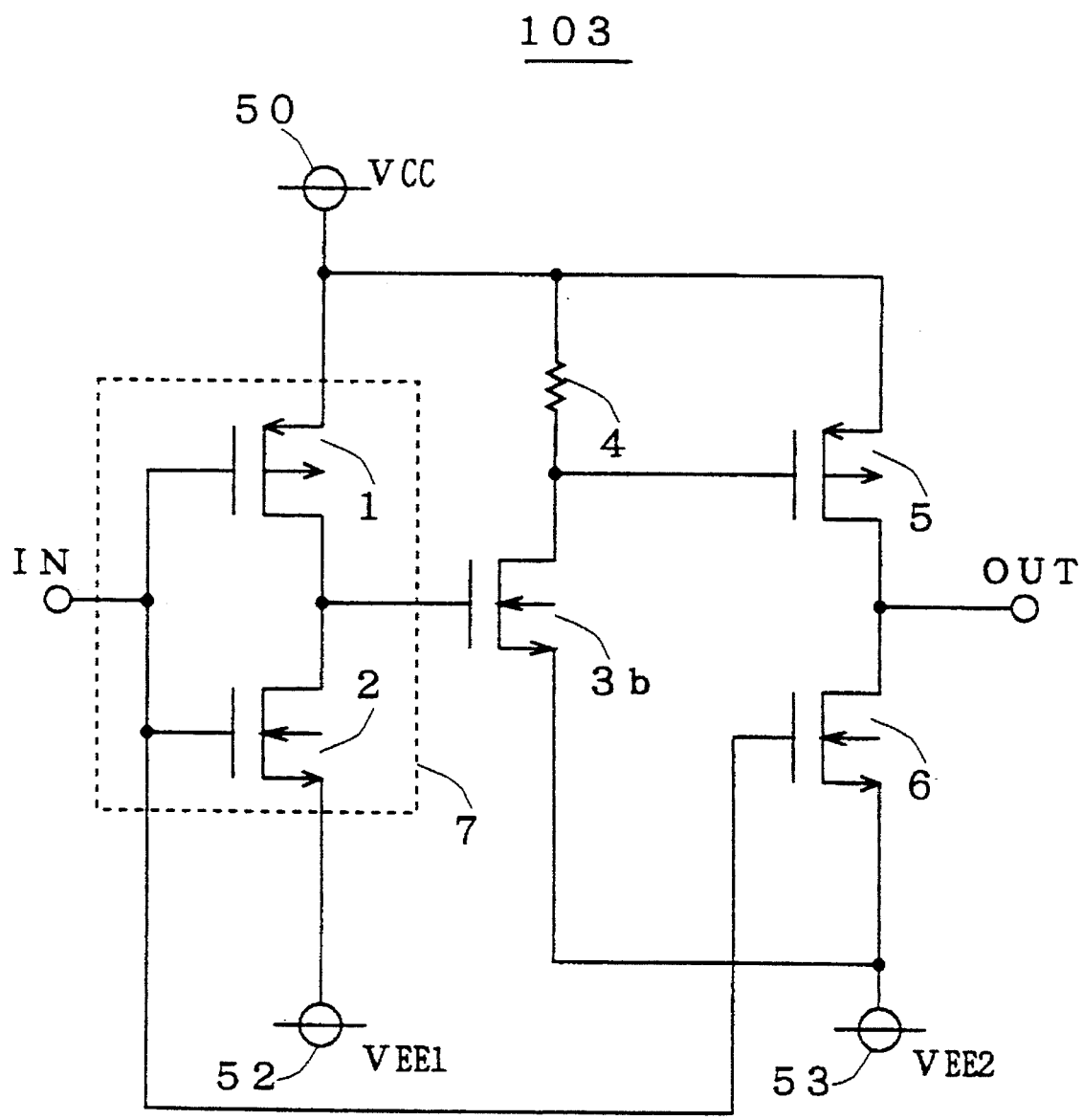
FIG. 14 is a circuit diagram showing a third preferred embodiment in accordance with the present invention.

FIG. 14 is a circuit diagram showing a configuration of a CMOS input circuit 103 in accordance with a third preferred embodiment of the present invention. The CMOS circuit 7 is provided with the potentials $V_{CC}$ and $V_{EE1}$. In more detail, the gates of the P-channel transistor 1 and the N-channel transistor 2 are connected in common to the input terminal IN. The sources of the P-channel transistor 1 and the N-channel transistor 2 are connected to the potential points 50 and 52, respectively.

The gate of an N-channel transistor 3b is connected to the drains of the P-channel transistor I and the N-channel transistor 2 in common. The drain thereof is connected to the potential point 50 through the resistor 4, and the source thereof is connected to the potential point 53.

The gate of the P-channel transistor 5 is connected to the drain of the N-channel transistor 3b and the resistor 4 in common, and the source thereof is connected to the potential point 50. The source of the N-channel transistor 6 is connected to the potential point 53, and the drain thereof and the drain of the N-channel transistor 5 are connected in common to the output terminal OUT. The gate of the N-channel transistor 6 is connected to the input terminal IN.

Now, the operation of the CMOS input circuit 103 will be described. When the input terminal IN receives a signal which takes the potential $V_{EE1}$ corresponding to a logic level "L", the N-channel transistor 3b turns on and its drain is provided with the potential $V_{EE1}$. Accordingly, the P-channel transistor 5 turns on. On the other hand, the N-channel transistor 6, the gate of which is connected to the input terminal IN, receives the potential $V_{EE1}$ to thereby turn off.

Therefore, the potential $V_{CC}$ is applied to the output terminal OUT.

On the other hand, when the input terminal IN receives a signal which takes the potential $V_{CC}$ corresponding to a logic level "H", the N-channel transistor 3b turns off. At this time, the N-channel transistor 6 receives the potential $V_{CC}$ through the gate, to thereby turn on. Since a regular circuit for applying a signal to the input terminal IN has a great driving capability, the switching operation is quickly performed. On the other hand, the potential at the gate of the P-channel transistor 5 begins to rise toward the potential $V_{CC}$ through the resistor 4. The time constant of the potential rise, having no relation to the gate capacitance of the N-channel transistor 6, is smaller like in the CMOS input circuit 101. Hence, the potential rise at the gate of the P-channel transistor 5 can be performed more quickly like in the CMOS input circuit 101.

Thus, the third preferred embodiment has a function to perform a potential change of the same logic level for one logic level, and moreover, achieves a high-speed operation, like the first preferred embodiment. Furthermore, the first preferred embodiment ensures a high-speed operation in a case of potential change from the logic level "H" to "L" at the input terminal IN, while the third preferred embodiment ensures a high-speed operation in a case of potential change from the logic level "L" to "H" at the input terminal IN.

It is also possible, of course, to achieve a further high-speed operation by substituting a current source for the resistor 4 of the CMOS input circuit 103, like in the CMOS input circuit 102.

(B-5) The Fourth Preferred Embodiment

From (B-1) through (B-4), the CMOS input circuits for changing a potential to a different potential of the logic level "L" have been described. It is obvious, however, that the present invention is applicable to a case of potential change of the logic level "H", without difficulty.

Figure 15:
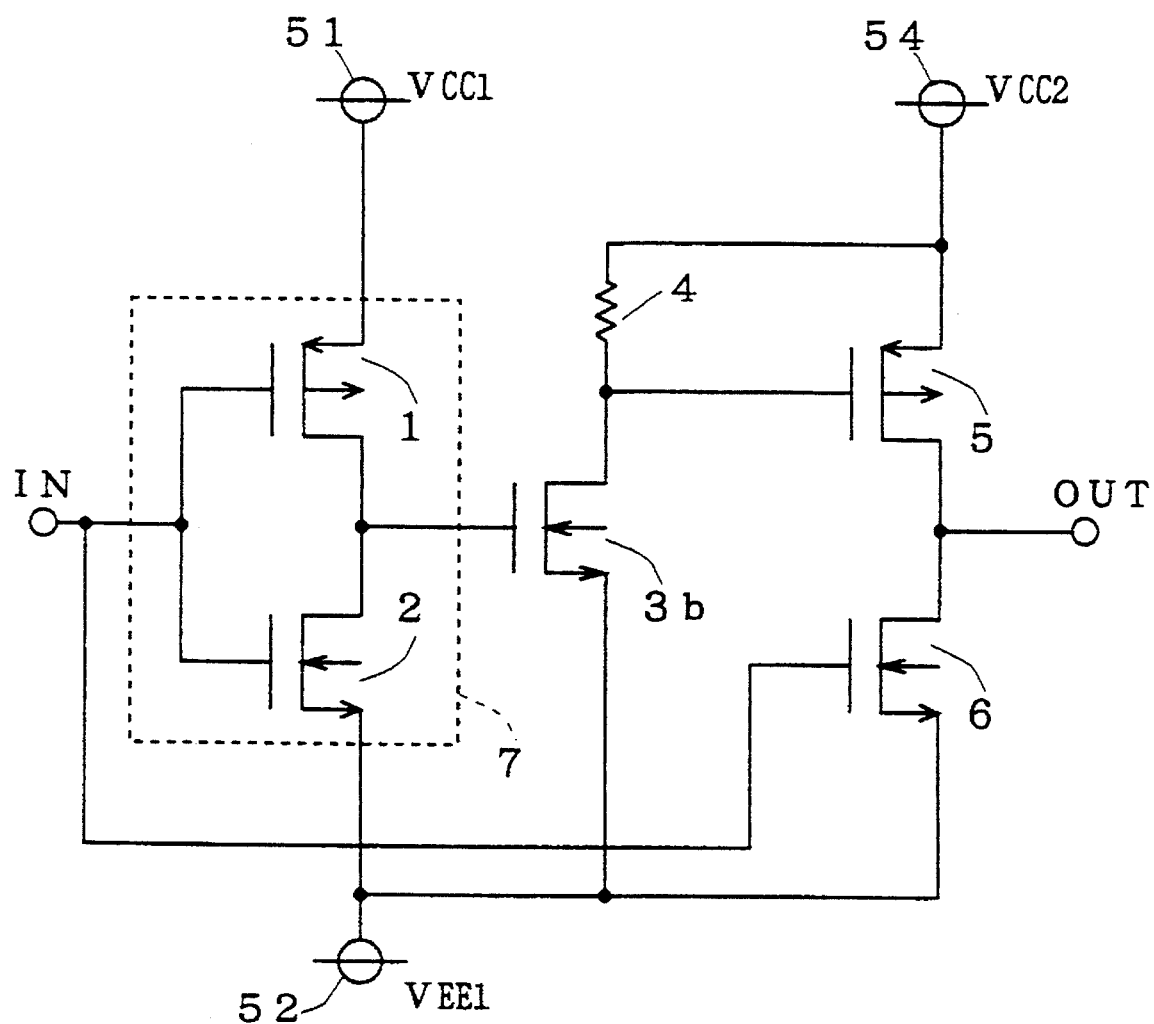
FIGS. 15 and 16 are circuit diagrams showing a fourth preferred embodiment in accordance with the present invention.

FIG. 15 is a circuit diagram showing a configuration of a CMOS input circuit 104, which is an example of application of the present invention to the case of potential change of the logic level "H". In order to change the potential $V_{CC1}$ to the potential $V_{CC2}$ both corresponding to the logic level "H", the CMOS input circuit 104 comprises potential points 51 and 54 for providing the potentials $V_{CC1}$ and $V_{CC2}$, e.g. 5 V and 3 V, respectively.

The CMOS circuit 7 is provided with the potentials $V_{CC1}$ and $V_{EE1}$, and applies an output to the gate of the N-channel transistor 3b. The source of the N-channel transistor 3b is connected to the potential point 52, and the drain thereof is connected to the potential point 54 through the resistor 4. The sources of the P-channel transistor 5 and the N-channel transistor 6 are connected to the potentials points 54 and 52, respectively, and the drains of these transistors are connected in common to the output terminal OUT. The gate of the P-channel transistor 5 is connected to the drain of the N-channel transistor 3b, and the gate of the N-channel transistor 6 is connected to the input terminal IN.

The CMOS input circuit 104, having the above configuration, achieves a quicker operation as compared with the case of the preliminary-stage idea when a signal is applied thereto through the input terminal IN to cause a change of logic level into the one corresponding to the potential to be changed (change of logic level from "L" to "H" herein). In this point, the CMOS input circuit 104 has a likeness to the CMOS input circuit 101.

Figure 16:
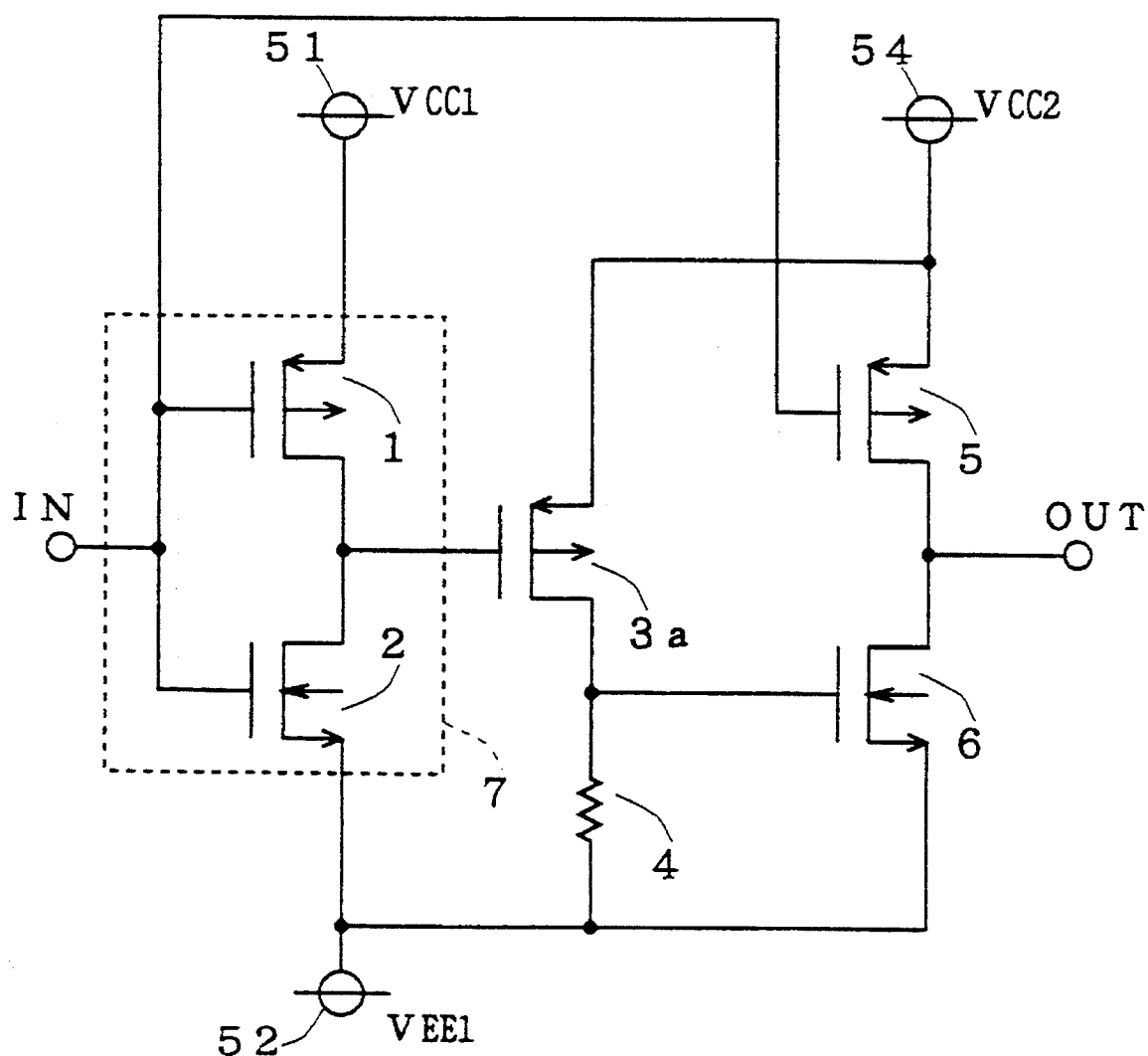

FIG. 16 is a circuit diagram showing a configuration of a CMOS input circuit 105. The CMOS input circuit 105 has a likeness to the CMOS input circuit 103 in that it achieve a quicker operation when a signal is applied thereto through the input terminal IN to cause a change of logic level from the one corresponding to the potential to be changed into the other (change of logic level from "H" to "L" herein).

The CMOS circuit 7 is provided with the potentials $V_{CC1}$ and $V_{EE1}$ and applies an output to the gate of the P-channel transistor 3a. The source of the P-channel transistor 3a is connected to the potential point 54 and the drain thereof is connected to the potential point 52 through the resistor 4. The sources of the P-channel transistor 5 and the N-channel transistor 6 are connected to the potential points 54 and 52, respectively, and the drains of these transistors are connected in common to the output terminal OUT. The gate of the N-channel transistor 6 is connected to the drain of the P-channel transistor 3a, and the gate of the P-channel transistor 5 is connected to the input terminal IN.

That is, the CMOS input circuit 105 is to the CMOS input circuit 103 what the CMOS input circuit 104 is to the CMOS input circuit 101.

As a matter of course, a current source can be used instead of the resistor 4 in the CMOS input circuits 104 and 105 like in the CMOS input circuit 102.

C. Preferred Embodiments of Potential Change for Both Logic Levels

From the first through fourth preferred embodiments, the potential change for one level of the binary logic has been described. According to the present invention, however, it is possible to perform a potential change for both logic levels of "H" and "L".

(C-1) The Fifth Preferred Embodiment

Figure 17:
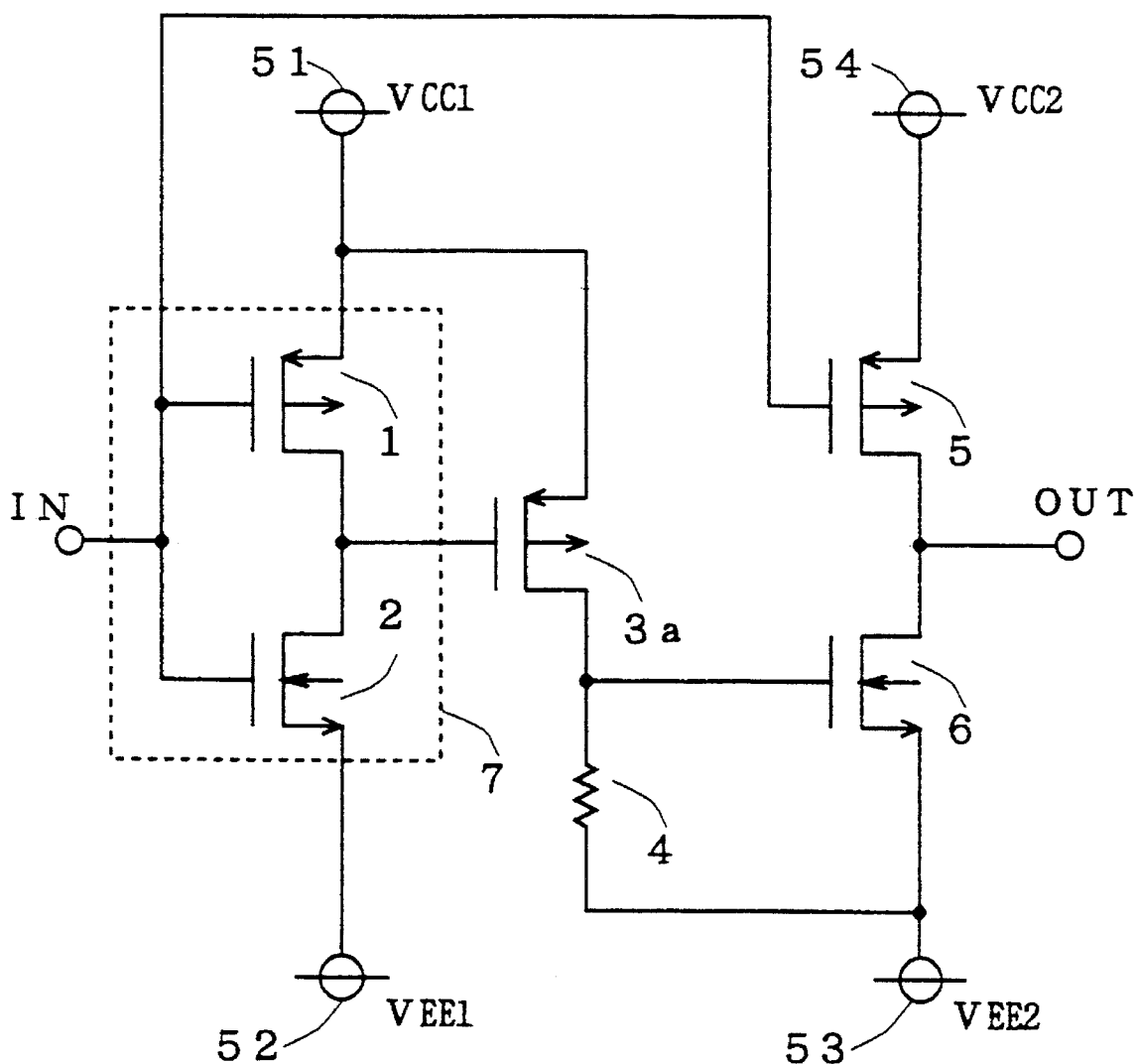
FIGS. 17 and 18 are circuit diagrams showing a fifth preferred embodiment in accordance with the present invention.

FIG. 17 is a circuit diagram showing a configuration of a CMOS input circuit 106 in accordance with a fifth preferred embodiment of the present invention. The CMOS circuit 7 is provided with the potentials $V_{CC1}$ (e.g. 5 V) and $V_{EE1}$ (e.g. −5 V) corresponding to the logic levels "H" and "L", respectively, of the signals received by the input terminal IN. In more detail, the gates of the P-channel transistor 1 and the N-channel transistor 2 are connected in common to the input terminal IN. The source of the P-channel transistor 1 is connected to the potential point 51 providing the potential $V_{CC1}$, and the source of the N-channel transistor 2 is connected to the potential point 52 providing the potential $V_{EE1}$.

The gate of the P-channel transistor 3a is connected to the drains of the P-channel transistor 1 and the N-channel transistor 2 in common. The drain of the P-channel transistor 3a is connected to the potential point 53 through the resistor 4. The source thereof is connected to the potential point 51.

The gate of the N-channel transistor 6 is connected to the drain of the P-channel transistor 3a and the resistor 4 in common, and the source thereof is connected to the potential point 53. The source of the P-channel transistor 5 is connected to the potential point 54. The drains of the P-channel transistor 5 and the N-channel transistor 6 are connected in common to the output terminal OUT. The gate of the P-channel transistor 5 is connected to the input terminal IN.

The potential points 53 and 54 provide the potentials $V_{CC2}$ and $V_{EE2}$, respectively. The potentials $V_{CC2}$ and $V_{EE2}$ are set at e.g. 3 V and −3 V, respectively, corresponding to the logic level "H" and "L" of the signal to be applied to the output terminal OUT. The operation of changing a potential into a different potential of the same logic level will be described below.

When the input terminal IN receives a signal which takes the potential $V_{CC1}$ corresponding to a logic level "H", the P-channel transistor 3a receives the potential $V_{EE1}$ through the gate, to thereby turn on. At this time, the N-channel transistor 6 receives the potential $V_{CC1}$ through the gate, to thereby turn on. On the other hand, the P-channel transistor 5, the gate of which is provided with the potential $V_{CC1}$ equal to the potential of the input terminal IN, turns off. Therefore, the potential $V_{EE2}$ is applied to the output terminal OUT. Thus, when the input terminal IN receives the signal which takes the potential $V_{CC1}$ corresponding to the logic level "H", the output terminal OUT is provided with the signal which takes the potential $V_{EE2}$ corresponding to the logic level "L".

When the input terminal IN receives a signal which takes the potential $V_{EE1}$ corresponding to a logic level "L", the P-channel transistor 3a receives the potential $V_{CC1}$ through the gate, to thereby turn off. At this time, the N-channel transistor 6 turns off due to the potential drop at the gate caused by the potential point 53 which is connected thereto through the resistor 4. Like the first through third preferred embodiments, since the resistor 4 is not connected to the gate of the P-channel transistor 5, the changes from the on-state to the off-state are quickly performed. Moreover, since the gate of the P-channel transistor 5 receives the potential $V_{EE1}$ which is applied to the input terminal IN, the P-channel transistor 5 turns on quickly. Therefore, the output terminal OUT is provided with the potential $V_{CC2}$ corresponding to the logic level "H".

Thus, the fifth preferred embodiment achieves a quick inversion of the logic level, like the first through fourth preferred embodiments. Moreover, according to the fifth preferred embodiment, it is possible to perform a potential change of the same logic level for both logic levels.

Figure 18:
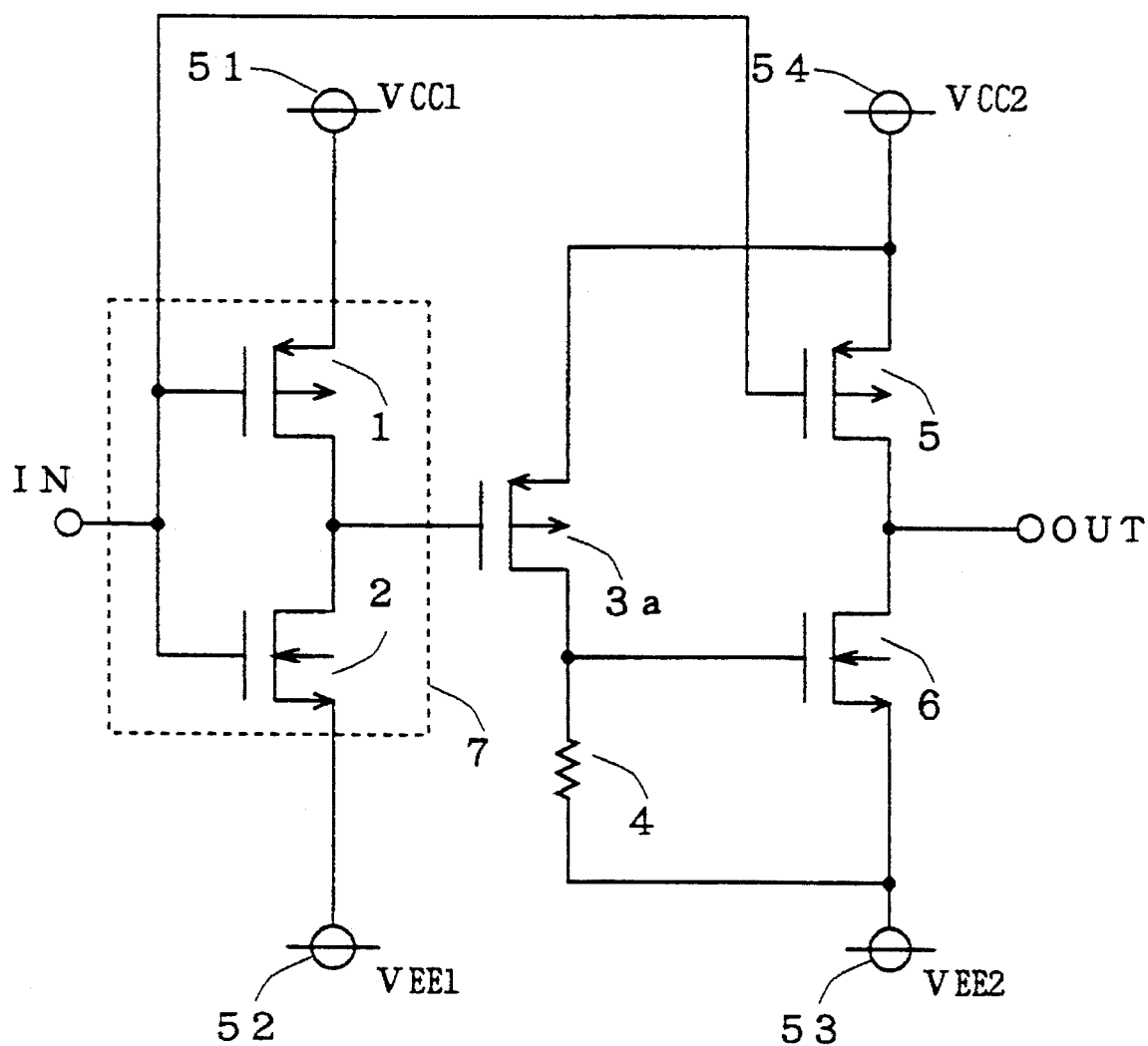

Since the P-channel transistor 3a makes the N-channel transistor 6 turn on only when it turns on, the source thereof does not always require the potential $V_{CC1}$. FIG. 18 is a circuit diagram showing a configuration of a CMOS input circuit 107. The CMOS input circuit 107 is different from the CMOS input circuit 106 only in that the source of the P-channel transistor 3a is connected to the potential point 54. Thus, also in the case that the source of the P-channel transistor 3a is provided with the potential $V_{CC2}$, when the P-channel transistor 3a turns on, the N-channel transistor 6 turns on. Therefore, the CMOS input circuit 107 achieves the same effect as the CMOS input circuit 106. Furthermore, a current source can be used instead of the resistor 4 like in the second preferred embodiment.

(C-2) The Sixth Preferred Embodiment

Although the fifth preferred embodiment ensures an improvement in operation speed in the case of the change from the logic level "H" to "L" of the signal received by the input terminal IN, the present invention can be applicable to the opposite case like in the third preferred embodiment.

Figure 19:
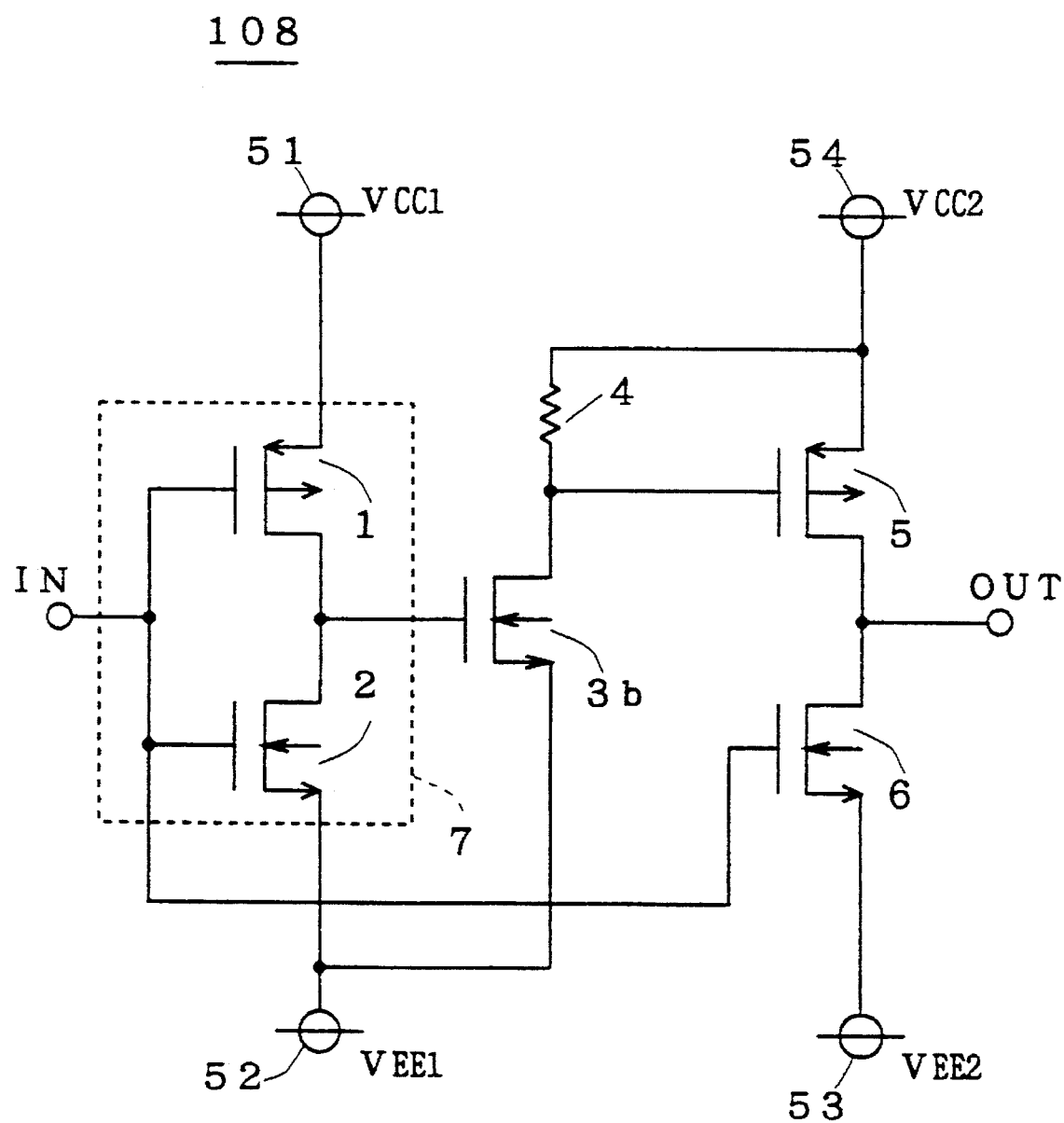
FIG. 19 is a circuit diagram showing a sixth preferred embodiment in accordance with the present invention.

FIG. 19 is a circuit diagram showing a configuration of a CMOS input circuit 108 in accordance with a sixth preferred embodiment of the present invention. The gate of the N-channel transistor 3b is connected to the drains of the P-channel transistor 1 and the N-channel transistor 2 in common. The drain of the N-channel transistor 3b is connected to the potential point 54 through the resistor 4. The source thereof is connected to the potential point 52.

The gate of the P-channel transistor 5 is connected to the drain of the N-channel transistor 3b and the resistor 4 in common, and the source thereof is connected to the potential point 54. The source of the N-channel transistor 6 is connected to the potential point 53. The drains of the N-channel transistor 6 and the P-channel transistor 5 are connected in common to the output terminal OUT. The gate of the N-channel transistor 6 is connected to the input terminal IN.

Thus, the CMOS input circuit 108 is to the CMOS input circuit 106 what the CMOS input circuit 103 is to the CMOS input circuit 101, and therefore, the sixth preferred embodiment achieves the same effect as the fifth preferred embodiment.

As a matter of course, the source of the N-channel transistor 3b may be connected to the potential point 53 like in the CMOS input circuit 107. Moreover, a current source can be used instead of the resistor 4 like in the second preferred embodiment.

D. Modification

Figure 20:
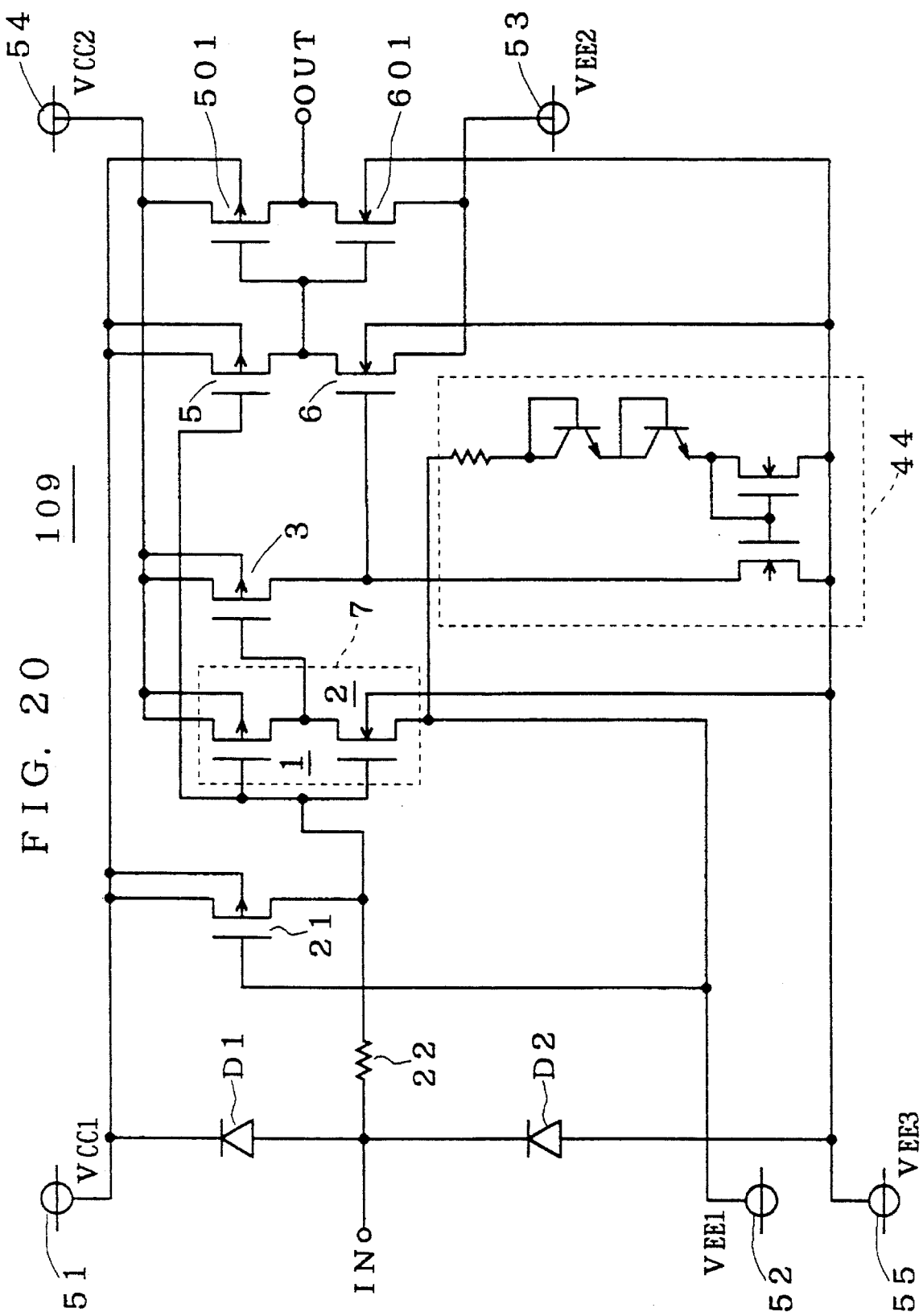
FIG. 20 is a circuit diagram showing a modification in accordance with the present invention.

FIG. 20 is a circuit diagram showing a configuration of a CMOS input circuit 109 which is an application of the present invention. The CMOS input circuit 109 is connected to potential points 51, 54, 52, 53 and 55 providing potentials $V_{CC1}$, $V_{CC2}$, $V_{EE1}$, $V_{EE2}$ and $V_{EE3}$, respectively. These potentials are set at e.g. 5 V, 3 V, 0 V, −3 V and −5 V, respectively. The CMOS input circuit 109 has a function to change a signal of a potential 5 v or 0 V corresponding to the logic level "H" or "L" (referred to as "5 V-system signal" hereinafter) into a signal of a potential 3 V or −3 V corresponding to "H" or "L" (referred to as "3 V-system signal" hereinafter).

Figure 21:
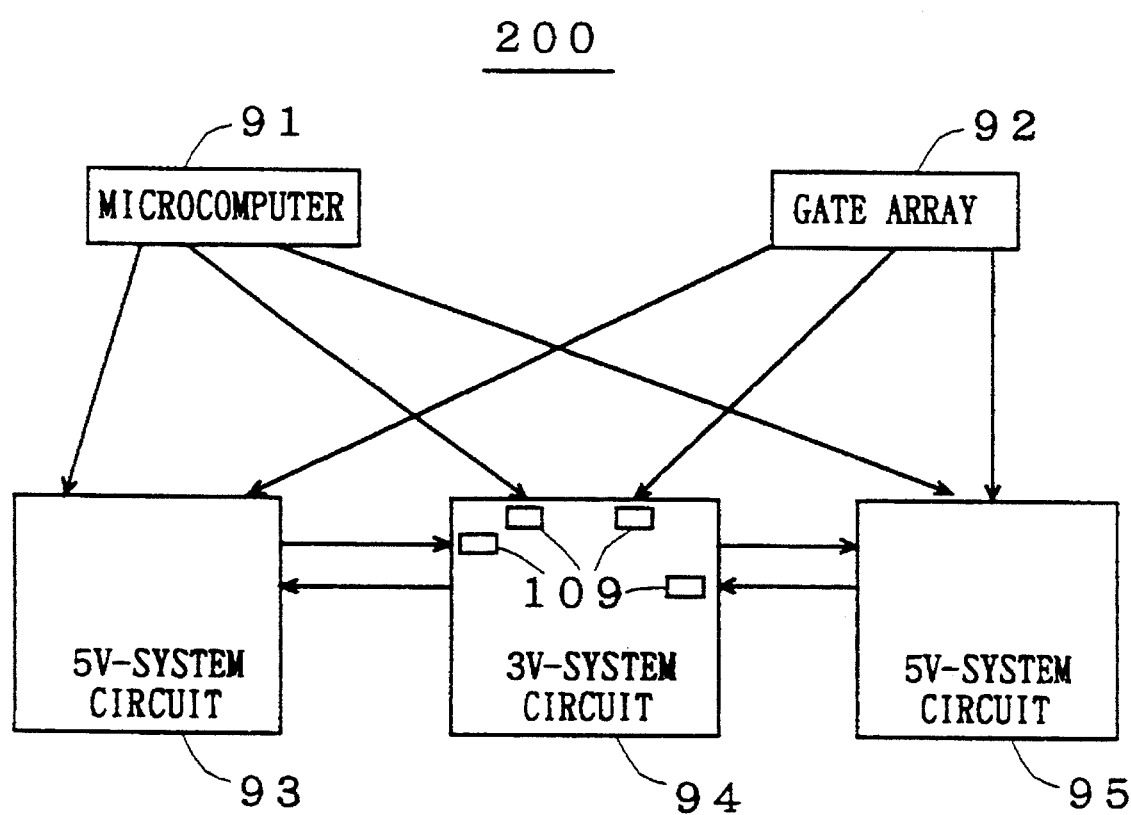
FIGS. 21 and 22 are block diagrams showing a modification in accordance with the present invention.

FIG. 21 is a block diagram illustrating a configuration of a circuit 200 which utilizes the CMOS input circuit 109. The circuit 200 has a circuit 94 for processing the 3 V-system signal (referred to as "3 V-system circuit" hereinafter) and circuits 93 and 95 for processing the 5 V-system signal (referred to as "5 V-system circuit" hereinafter). The circuits 93 to 95 receive a control command from a microcomputer 91 and a predetermined signal from a gate array 92. When the control command form the microcomputer 91 and the signal from the gate array 92 are 5 V-system signals, the 5 V-system circuits 93 and 95 may receive these signals without changing the potential. However, in this case, the 3 V-system circuit 94 needs to change the potential of these signals. In addition, the 3 V-system circuit 94 needs to change the potential of signals delivered from the 5 V-system circuits 93 and 95.

Figure 22:
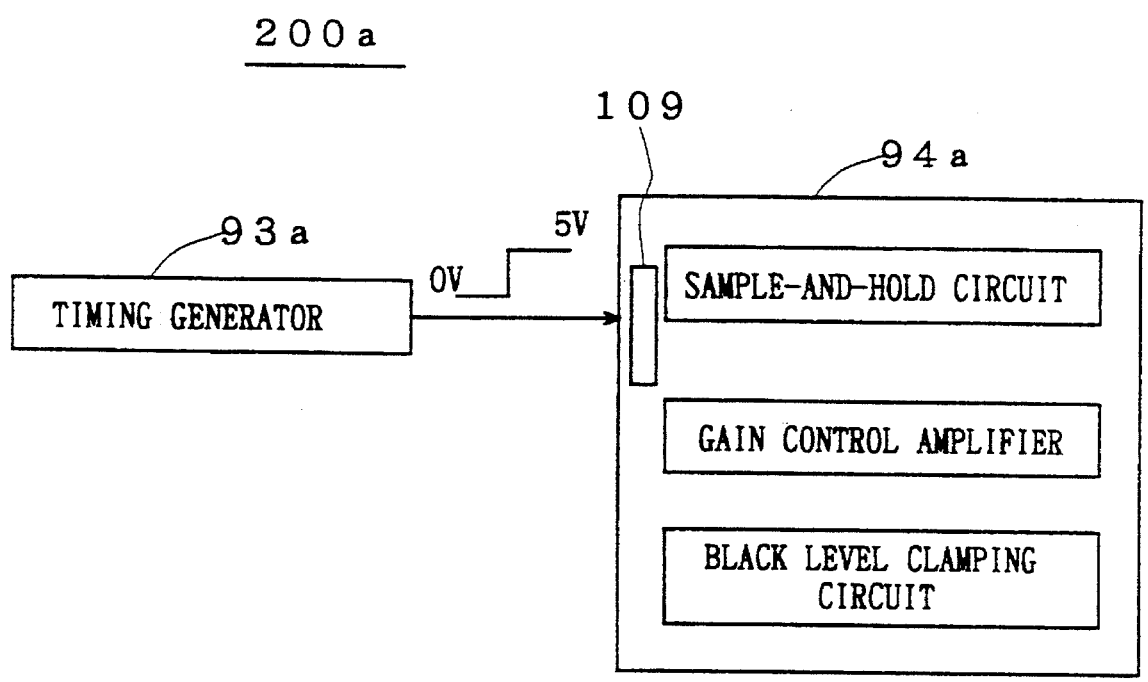
Figure 23:
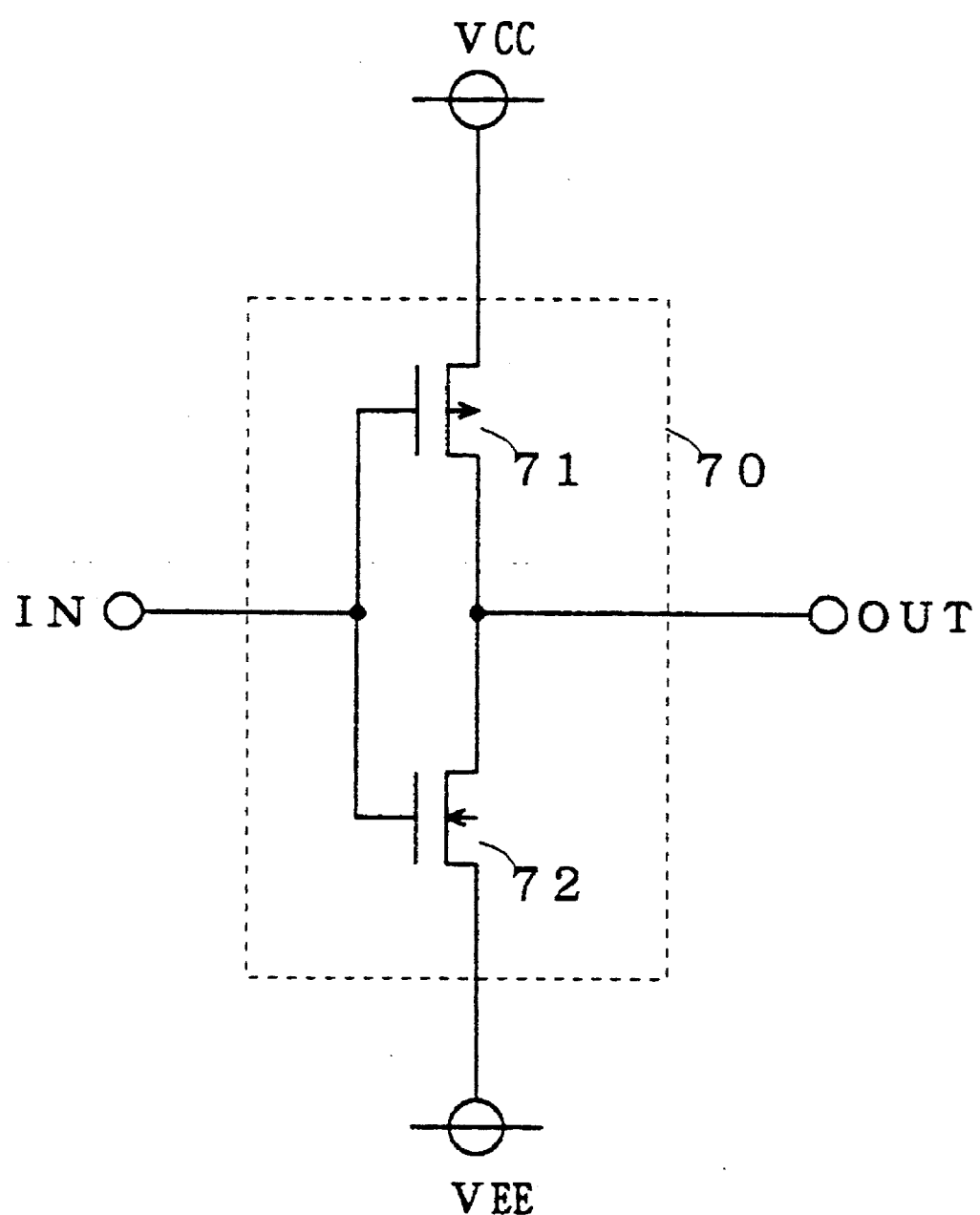
FIG. 23 is a circuit diagram showing a conventional art.

FIG. 22 is a block diagram of an exemplary apparatus for processing signals of various potentials corresponding to the same logic level. A circuit 200a is a part of a copying machine. A timing generator 93a applies a signal of potential ranging of 0 to 5 V to a signal processing circuit 94a. The signal processing circuit 94a comprises a sample-and-hold circuit, a gain control amplifier and a black level clamping circuit, all of which process ±5 V-system signal. In this case, taking a breakdown voltage into account, it is necessary to reduce a voltage across the CMOS circuit of a BiCMOS circuit. When the CMOS circuit is used as a switch in the ±5 V system circuit, it is necessary to drive the switch with the ±3 V signals. Therefore, there arises a need for such a circuit as the CMOS input circuit 109.

Referring again to FIG. 20, the circuit configuration and operation of the CMOS input circuit 109 will be described. For the purpose of protection against spike of the signal received by the input terminal IN, the input terminal IN is connected to potential points 51 and 55 through diodes D1 and D2, respectively, and further connected to the CMOS circuit 7 through a resistor 22. A P-channel transistor 21, which is connected to the potential point 52 by the gate to be always in an on-state, is connected between the potential point 51 and a connection of the resistor 22 and the CMOS circuit 7, thereby ensuring a pull-up.

The CMOS circuit 7 of the CMOS input circuit 109 has the same configuration as that of the CMOS input circuit 107 in accordance with the fifth preferred embodiment. The source of the N-channel transistor 2 is connected to the potential point 52 like in the fifth preferred embodiment, but the source of the P-channel transistor 51 is connected to the potential 54, not to potential point 51. In this connection, when the potential of 5 V corresponding to the logic level "H" of the 5 V-system signal is applied to the gates of the P-channel transistor 1 and the N-channel transistor 2 in common, the P-channel transistor 1 turns off because the applied potential is higher than the potential of 3 V provided by the potential point 54. On the other hand, the N-channel transistor 2 turns on. Thus, also in the CMOS input circuit 109, the CMOS circuit 7 performs the same operation as in the CMOS input circuit 107.

The gate of P-channel transistor 3a is connected to the drains of the transistors 1 and 2 of the CMOS circuit 7 in common, the source thereof is connected to the potential point 54, and the drain thereof is connected to the gate of the N-channel transistor 6 like in the CMOS input circuit 107. The gate of the N-channel transistor 6 is connected to a current source 44 instead of the resistor 4. As mentioned in the fifth preferred embodiment, if the current source 44 is used instead of the resistor 4, the same effect can be achieved.

Furthermore, the current source 44 is connected between the gate of the N-channel transistor 6 and the potential point 55. The reason is that the current source 44 extracts positive charges from the gate of the N-channel transistor 6 when it makes the N-channel transistor 6 turn off, even if the current source 44 is not always provided with the potential $V_{EE2}$. Since the P-channel transistor 3a turns on when the N-channel transistor 6 turns on, the potential $V_{EE3}$ of the potential point 55 has no influence on the operation.

The potential point 55 provides the potential $V_{EE3}$ as a back gate potential of N-channel transistors including the transistors constituting the current source 44 and a transistor 601 which will be mentioned later. Although the back gate potential of the N-channel transistor 6 also takes the potential of $V_{EE3}$, the source of the N-channel transistor 6 is connected to the potential point 53 to be provided with the potential $V_{EE2}$, like in the CMOS input circuit 107, which is set higher than the potential $V_{EE3}$, so that the potential $V_{EE3}$ has no influence on the operation of the N-channel transistor 6.

The gate of the P-channel transistor 5 is connected to the input terminal IN, like in the CMOS input circuit 107, and the drain thereof is connected to the drain of the N-channel transistor 6. The source of the P-channel transistor 5 is connected to the potential point 51.

Therefore, the potentials $V_{CC1}$ and $V_{EE2}$ correspond to the logic levels "H" and "L", respectively, at the point to which the drains of the P-channel transistor 5 and the N-channel transistor 6 are connected in common, corresponding to the output terminal OUT of the CMOS input circuit 107. That is, the potential of logic level "H" is not changed. Accordingly, another circuit applying the potential $V_{CC2}$ corresponding to the logic level "H" is needed in order to obtain the 3 V-system signal.

A P-channel transistor 501 is provided to apply $V_{CC2}$ corresponding to the logic level "H", and the gate thereof is connected to the drains of the P-channel transistor 5 and the N-channel transistor 6 in common. The source of the P-channel transistor 501 is connected to the potential point 54, thereby being provided with the potential $V_{CC2}$. The drain thereof is connected to the drain of an N-channel transistor 601, and further the drains are connected to the output terminal OUT. The source of the N-channel transistor 601 is connected to the potential point 53, thereby being provided with the potential $V_{EE2}$, and the gate thereof is connected to the gate of the P-channel transistor 501.

As described in association with the operation of the CMOS circuit 7 in the CMOS input circuit 109, the source of the P-channel transistor 501 is provided with the potential $V_{CC2}$. However, since the potential $V_{CC2}$ is lower than the potential $V_{CC1}$, the transistor 501 turns off when the potential $V_{CC1}$ is applied to the gates of the transistors 501 and 601. When the potential $V_{EE2}$ is applied thereto, the transistor 501 naturally turns on. Accordingly, the output terminal OUT is provided with the potential $V_{CC2}$ or $V_{EE2}$ corresponding to the logic level "H" or "L".

Thus, in the CMOS input circuit 109, the potential of logic level "L" is changed first and the potential of logic level "H" is changed afterwards, and in conclusion, the potentials of both logic levels can be changed.

Furthermore, although the N-channel transistor 501 is provided with the potential $V_{CC1}$ from the potential point 51 as a back gate potential, there arises no hindrance to the operation of the N-channel transistor 501 due to the potential $V_{CC1}$, as it is higher than the potential $V_{CC2}$ applied to the source thereof. While the invention has been shown and described in detail, the foregoing description is in all aspects illustrative and not restrictive. It is therefore understood that numerous modifications and variations can be devised without departing the scope of the invention.

I claim:

1. A CMOS input circuit, comprising:
   (a) an input terminal for receiving an input signal corresponding to a first logic level or a second logic level which are complementary to each other;
   (b) an invertor for receiving said input signal to output an intermediate signal which takes a first potential corresponding to said first logic level when said input signal corresponds to said second logic level, or takes a second potential corresponding to said second logic level when said input signal corresponds to said first logic level;
   (c) a switching element having a first end provided with a third potential corresponding to said first logic level and a second end, for insulating said first and second ends when said intermediate signal corresponds to said first logic level, or conducting said first and second ends when said intermediate signal corresponds to said second logic level;
   (d) a first MOS transistor having a gate provided with said input signal, a source provided with a fourth potential corresponding to said first logic level and a drain, for turning off when said input signal corresponds to said first logic level, or turning on when said input signal corresponds to said second logic level;
   (e) a second MOS transistor having a gate connected to said second end of said switching element, a source provided with a fifth potential corresponding to said second logic level and a drain, for turning on when said third potential is applied to said gate;
   (f) a current supply circuit connected to said gate of said second MOS transistor, for supplying a current flowing in a direction to turn off said second MOS transistor; and
   (g) an output terminal coupled to said drains of said first and second MOS transistors in common.

2. The CMOS input circuit of claim 1, wherein
   said switching element has a third MOS transistor including a gate for receiving said intermediate signal, a source connected to said first end and a drain connected to said second end.

3. The CMOS input circuit of claim 1, wherein said invertor has;
   (b-1) a third MOS transistor including a gate for receiving said input signal, a source provided with said first potential and a drain, for turning off/on respectively when said input signal corresponds to said first/second logic level; and
   (b-2) a fourth MOS transistor including a gate for receiving said input signal, a source provided with said second potential and a drain, for turning on/off respectively when said input signal corresponds to said first/second logic level, and said drains of said third and fourth MOS transistors are connected in common to provide said intermediate signal.

4. The CMOS input circuit of claim 1, wherein an ON-resistance of said first MOS transistor is higher than an ON-resistance of said second MOS transistor.

5. The CMOS input circuit of claim 1, wherein a gate capacitance of said first MOS transistor is larger than a gate capacitance of said second MOS transistor.

6. The CMOS input circuit of claim 1, wherein a gate width of said first MOS transistor is larger than a gate width of said second MOS transistor.

7. The CMOS input circuit of claim 1, wherein said third potential is equal to said first potential.

8. The CMOS input circuit of claim 7, wherein said fourth potential is equal to said first potential.

9. The CMOS input circuit of claim 8, wherein said current supply circuit is provided with a sixth potential corresponding to said second logic level.

10. The CMOS input circuit of claim 9, wherein said sixth potential is equal to said fifth potential.

11. The CMOS input circuit of claim 10, wherein said current supply circuit essentially consists of a resistor including a first end connected to said gate of said second MOS transistor and a second end provided with said sixth potential.

12. The CMOS input circuit of claim 10, wherein said current supply circuit essentially consists of a current source including a first end connected to said gate of said second MOS transistor and a second end provided with said sixth potential.

13. The CMOS input circuit of claim 7, wherein said current supply circuit is provided with a sixth potential corresponding to said second logic level.

14. The CMOS input circuit of claim 13, wherein said sixth potential is equal to said fifth potential.

15. The CMOS input circuit of claim 14, wherein said current supply circuit essentially consists of a resistor including a first end connected to said gate of said second MOS transistor and a second end provided with said sixth potential.

16. The CMOS input circuit of claim 14, wherein said current supply circuit essentially consists of a current source including a first end connected to said gate of said second MOS transistor and a second end provided with said sixth potential.

17. The CMOS input circuit of claim 13, wherein a potential difference between said sixth potential and said first potential is larger than any of a potential difference between said second potential and said first potential and a potential difference between said fifth potential and said first potential.

18. The CMOS input circuit of claim 17, wherein said current supply circuit essentially consists of a current source including a first end connected to said gate of said second MOS transistor and a second end provided with said sixth potential.

19. The CMOS input circuit of claim 17, wherein a potential difference between said fourth potential and said fifth potential is larger than a potential difference between said first potential and said fifth potential.

20. The CMOS input circuit of claim 19, wherein said input signal takes a seventh/an eighth potential corresponding to said first/second logic level respectively, and a potential difference between said seventh potential and said second potential and a potential difference between said eighth potential and said first potential are each equal to or more than a potential difference between said first potential and said second potential.

21. The CMOS input circuit of claim 20, further comprising:

(h) a third MOS transistor having a gate connected in common to said drains of said first and second MOS transistors, a source provided with said first potential and a drain connected to said output terminal, for turning off when said gate receives said fourth potential, or turning on when said gate receives said fifth potential; and (i) a fourth MOS transistor having a gate connected in common to said drains of said first and second MOS transistors, a source provided with said fifth potential and a drain connected to said output terminal, for turning on when said gate receives said fourth potential, or turning off when said gate receives said fifth potential.

22. The CMOS input circuit of claim 1, wherein said third potential is equal to said fourth potential.

23. The CMOS input circuit of claim 22, wherein said current supply circuit is provided with a sixth potential corresponding to said second logic level.

24. The CMOS input circuit of claim 23, wherein said sixth potential is equal to said fifth potential.

25. The CMOS input circuit of claim 24, wherein said current supply circuit essentially consists of a resistor including a first end connected to said gate of said second MOS transistor and a second end provided with said sixth potential.

26. The CMOS input circuit of claim 24, wherein said current supply circuit essentially consists of a current source including a first end connected to said gate of said second MOS transistor and a second end provided with said sixth potential.

27. The CMOS input circuit of claim 23, wherein said sixth potential is equal to said second potential.

28. The CMOS input circuit of claim 27, wherein said fifth potential is equal to said second potential.

29. The CMOS input circuit of claim 28, wherein said current supply circuit essentially consists of a resistor including a first end connected to said gate of said second MOS transistor and a second end provided with said sixth potential.

30. The CMOS input circuit of claim 28, wherein said current supply circuit essentially consists of a current source including a first end connected to said gate of said second MOS transistor and a second end provided with said sixth potential.

31. The CMOS input circuit of claim 1, wherein said current supply circuit essentially consists of a resistor including a first end connected to said gate of said second MOS transistor and a second end provided with said sixth potential.

32. The CMOS input circuit of claim 1, wherein said current supply circuit essentially consists of a current source including a first end connected to said gate of said second MOS transistor and a second end provided with said sixth potential.

* * * * *